US009453625B2

(12) United States Patent
Maglica

(10) Patent No.: US 9,453,625 B2
(45) Date of Patent: Sep. 27, 2016

(54) LED FLASHLIGHT WITH IMPROVED HEAT SINK AND BATTERY PROTECTION

(71) Applicant: Mag Instrument, Inc., Ontario, CA (US)

(72) Inventor: Anthony Maglica, Ontario, CA (US)

(73) Assignee: MAG INSTRUMENT, INC, Ontario, CA (US)

( * ) Notice: Subject to any disclaimer, the term of this patent is extended or adjusted under 35 U.S.C. 154(b) by 0 days.

(21) Appl. No.: 15/148,505

(22) Filed: May 6, 2016

(65) Prior Publication Data

US 2016/0252221 A1    Sep. 1, 2016

Related U.S. Application Data

(63) Continuation-in-part of application No. 14/869,628, filed on Sep. 29, 2015, now Pat. No. 9,368,767, and a continuation-in-part of application No. 14/869,962, filed on Sep. 29, 2015, now Pat. No. 9,368,768, and a continuation-in-part of application No. 14/971,971, filed on Dec. 16, 2015.

(60) Provisional application No. 62/095,733, filed on Dec. 22, 2014.

(51) Int. Cl.
| | |
|---|---|
| *F21L 4/00* | (2006.01) |
| *F21V 17/12* | (2006.01) |
| *F21V 15/04* | (2006.01) |
| *F21V 7/00* | (2006.01) |
| *F21V 29/70* | (2015.01) |
| *F21V 19/00* | (2006.01) |
| *F21L 4/08* | (2006.01) |
| *H01L 33/62* | (2010.01) |
| *H01L 33/64* | (2010.01) |

(Continued)

(52) U.S. Cl.
CPC ............... *F21L 4/005* (2013.01); *F21L 4/085* (2013.01); *F21V 7/00* (2013.01); *F21V 15/04* (2013.01); *F21V 17/12* (2013.01); *F21V 19/005* (2013.01); *F21V 29/70* (2015.01); *H01L 33/483* (2013.01); *H01L 33/62* (2013.01); *H01L 33/642* (2013.01); *F21Y 2101/02* (2013.01)

(58) Field of Classification Search
CPC ..... F21L 4/027; F21L 4/005; F21V 23/0421; F21V 19/045; F21V 23/0407; F21V 29/70; F21V 7/00; F21V 15/04; F21V 17/12; F21V 19/005
USPC .................................. 362/249.02, 200, 205
See application file for complete search history.

(56) References Cited

U.S. PATENT DOCUMENTS

| | | |
|---|---|---|
| 4,286,311 A | 8/1981 | Maglica |
| 6,666,565 B2 | 12/2003 | Gabe |

(Continued)

FOREIGN PATENT DOCUMENTS

WO  PCT/US2015/066201     11/2015

*Primary Examiner* — Anabel Ton
(74) *Attorney, Agent, or Firm* — Roy L Anderson

(57) ABSTRACT

One electrical lead from an LED package is soldered to an inner electrically conductive member positioned and electrically isolated from an outer electrically conductive member by electrically insulating material while a second electrical lead and a neutral lead from the LED are soldered to the outer electrically conductive member so that heat is transferred from an LED die within the LED package to the outer electrically conductive member and then to a thermally conductive outer casing with a thermal path that minimizes thermal resistance and a tail cap is used to create a snug mechanical fit between a bottom surface of a metal can of a terminal battery held within the outer casing and the a surface of the tail cap.

20 Claims, 38 Drawing Sheets

(51) Int. Cl.
*H01L 33/48* (2010.01)
*F21Y 101/02* (2006.01)

(56) References Cited

U.S. PATENT DOCUMENTS

| | | | |
|---|---|---|---|
| 6,685,336 B1 | 2/2004 | Neiser | |
| 6,799,864 B2 | 10/2004 | Bohler et al. | |
| 6,827,468 B2 | 12/2004 | Galli | |
| 6,903,380 B2 * | 6/2005 | Barnett | F21V 19/0015 257/100 |
| 6,942,358 B2 | 9/2005 | Neiser | |
| 6,942,365 B2 | 9/2005 | Galli | |
| 6,966,677 B2 | 11/2005 | Galli | |
| 6,971,762 B2 * | 12/2005 | Galli | F21L 4/027 200/60 |
| 6,974,234 B2 | 12/2005 | Galli | |
| 7,055,989 B2 | 6/2006 | Galli | |
| 7,083,305 B2 | 8/2006 | Galli | |
| 7,093,954 B2 | 8/2006 | Sharrah et al. | |
| 7,118,255 B2 | 10/2006 | Galli | |
| 7,121,680 B2 | 10/2006 | Galli | |
| 7,153,004 B2 * | 12/2006 | Galli | F21L 4/027 362/191 |
| 7,188,978 B2 | 3/2007 | Sharrah et al. | |
| 7,201,492 B2 * | 4/2007 | Galli | F21L 4/027 362/157 |
| 7,214,952 B2 | 5/2007 | Klipstein et al. | |
| 7,321,161 B2 | 1/2008 | Teixeira et al. | |
| 7,490,951 B2 | 2/2009 | Klipstein et al. | |
| 7,614,760 B2 | 11/2009 | Sharrah et al. | |
| 7,652,303 B2 | 1/2010 | Galli | |
| 7,686,469 B2 | 3/2010 | Ruud et al. | |
| 7,771,087 B2 | 8/2010 | Wilcox et al. | |
| 7,798,667 B2 | 9/2010 | Klipstein | |
| 7,808,013 B2 | 10/2010 | Mendendorp et al. | |
| 7,850,345 B2 | 12/2010 | Holder et al. | |
| 7,950,818 B2 | 5/2011 | Klipstein et al. | |
| 8,093,620 B2 | 1/2012 | Galli | |
| 8,152,327 B2 | 4/2012 | Brands et al. | |
| 8,226,267 B2 | 7/2012 | Sharrah et al. | |
| 8,371,729 B2 | 2/2013 | Sharrah et al. | |
| 8,376,577 B2 | 2/2013 | Harbers et al. | |
| 8,388,167 B2 | 3/2013 | Klipstein et al. | |
| 8,395,058 B2 * | 3/2013 | Gibson | F21L 4/027 174/267 |
| 8,425,071 B2 | 4/2013 | Rudd et al. | |
| 8,662,701 B2 * | 3/2014 | Sharrah | H01H 13/503 200/1 B |
| 8,733,966 B2 | 5/2014 | Maglica | |
| 2004/0079957 A1 | 4/2004 | Andrews et al. | |
| 2004/0130894 A1 * | 7/2004 | Galli | F21V 5/04 362/202 |
| 2005/0017366 A1 | 1/2005 | Galli | |
| 2005/0243544 A1 | 11/2005 | Neiser | |
| 2007/0109775 A1 | 5/2007 | Chen | |
| 2007/0117273 A1 | 5/2007 | Elpedes et al. | |
| 2009/0218586 A1 | 9/2009 | Cho et al. | |
| 2010/0033972 A1 | 2/2010 | Maglica | |
| 2010/0219775 A1 | 9/2010 | Maglica | |
| 2010/0314655 A1 | 12/2010 | Thompson | |
| 2011/0012535 A1 | 1/2011 | West et al. | |
| 2011/0111536 A1 | 5/2011 | Bruner | |
| 2011/0227500 A1 | 9/2011 | West et al. | |
| 2011/0261557 A1 * | 10/2011 | Gibson | F21L 4/027 362/157 |
| 2012/0020104 A1 | 1/2012 | Biebl et al. | |
| 2012/0170262 A1 | 7/2012 | Hoetzl et al. | |
| 2013/0049582 A1 | 2/2013 | West et al. | |
| 2013/0070452 A1 | 3/2013 | Urano et al. | |
| 2013/0082600 A1 | 4/2013 | Ter-Hovhanissian et al. | |
| 2013/0099275 A1 | 4/2013 | Pi | |
| 2013/0135860 A1 | 5/2013 | Harbers et al. | |
| 2013/0148367 A1 | 6/2013 | Sharrah et al. | |
| 2013/0271983 A1 | 10/2013 | Leshniak et al. | |
| 2014/0036489 A1 * | 2/2014 | Catalano | H05B 33/0809 362/184 |
| 2014/0049961 A1 | 2/2014 | Wilcox et al. | |
| 2014/0104835 A1 | 4/2014 | Ruud et al. | |
| 2014/0211470 A1 | 7/2014 | Kinnune et al. | |
| 2014/0218902 A1 | 8/2014 | Maglica | |
| 2014/0218941 A1 | 8/2014 | Wilcox et al. | |
| 2014/0226339 A1 | 8/2014 | Kinnune et al. | |
| 2014/0247590 A1 | 9/2014 | Wilcox | |
| 2014/0347846 A1 | 11/2014 | Ahn et al. | |
| 2015/0043211 A1 | 2/2015 | Liu et al. | |
| 2015/0300621 A1 * | 10/2015 | Maglica | F21K 9/00 362/382 |

* cited by examiner

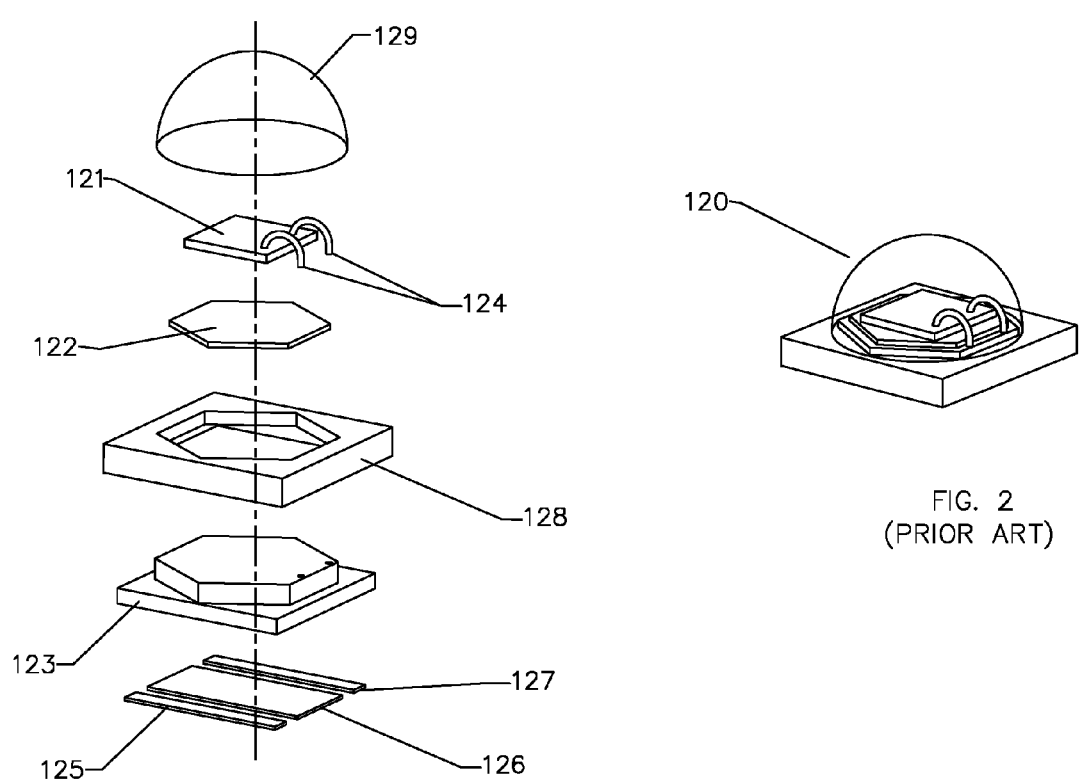

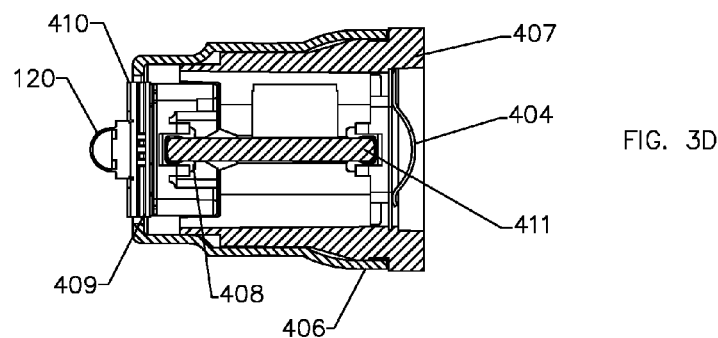
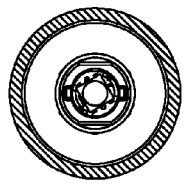
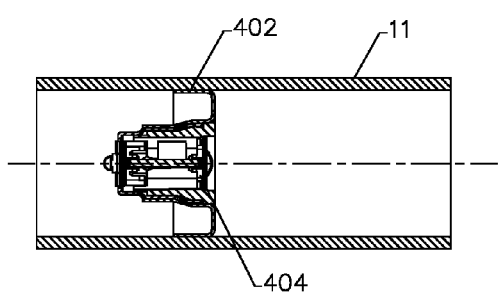
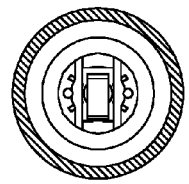
FIG. 3A
FIG. 3B
(PRIOR ART)
FIG. 3C

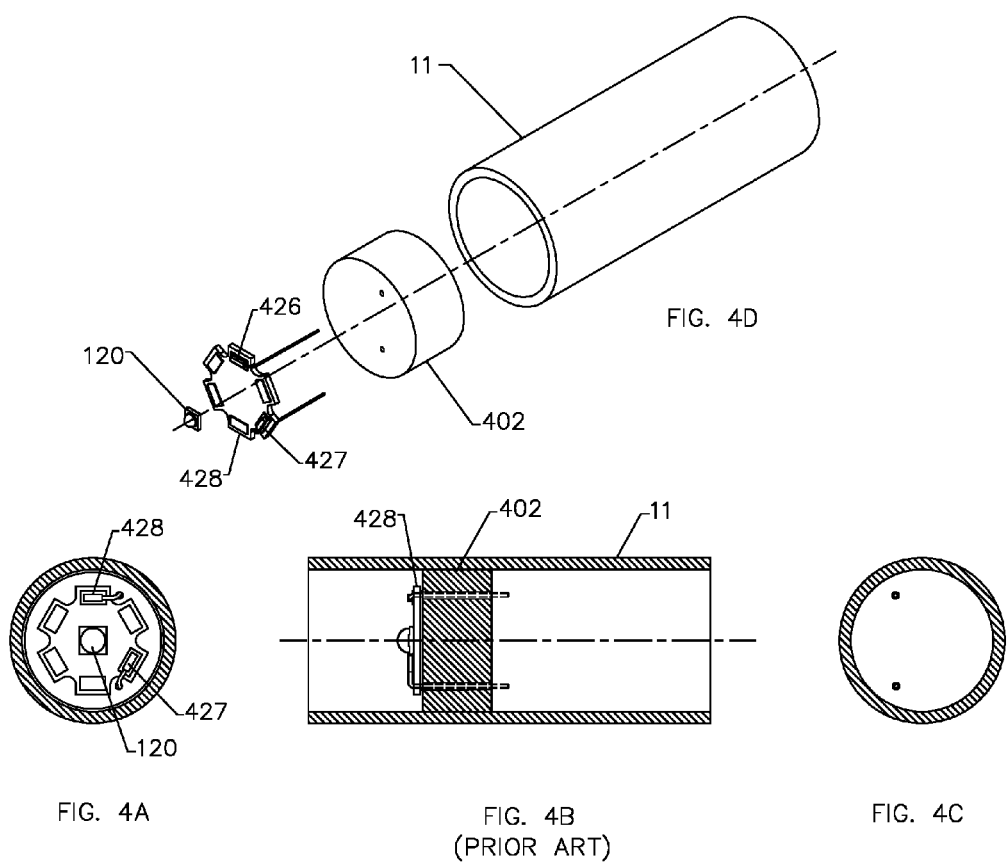

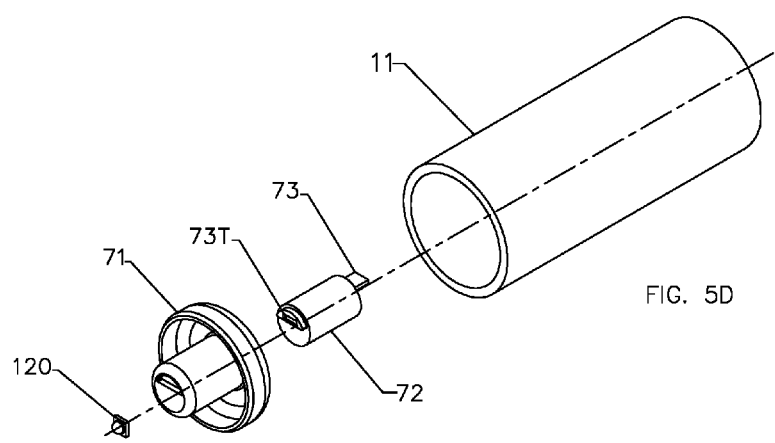
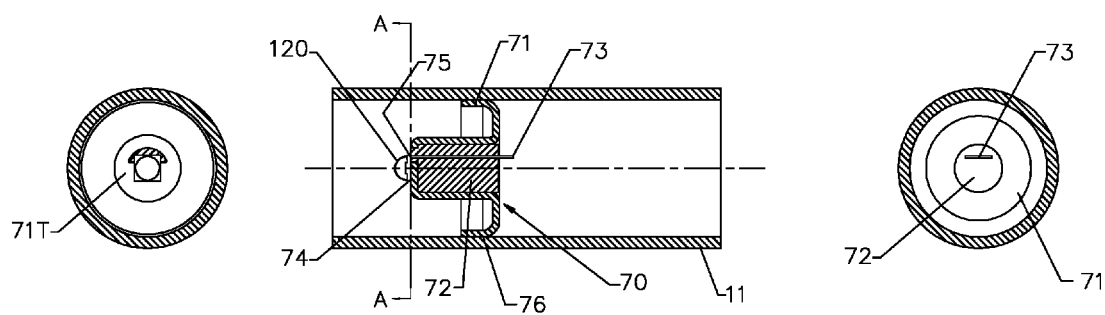
FIG. 5A  FIG. 5B  FIG. 5C

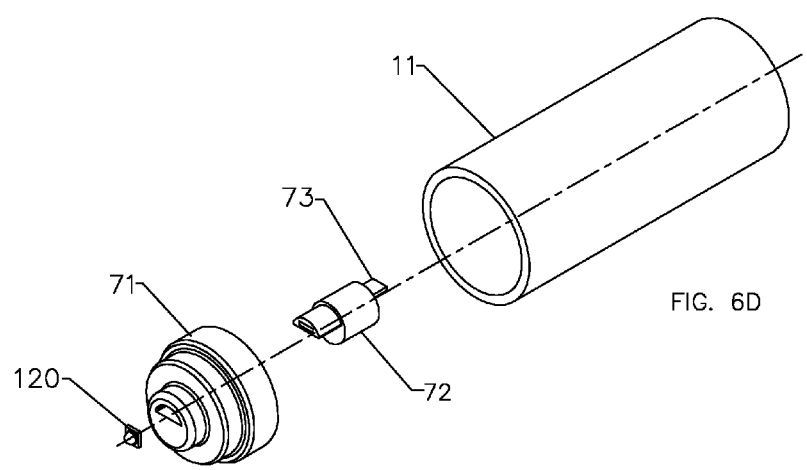
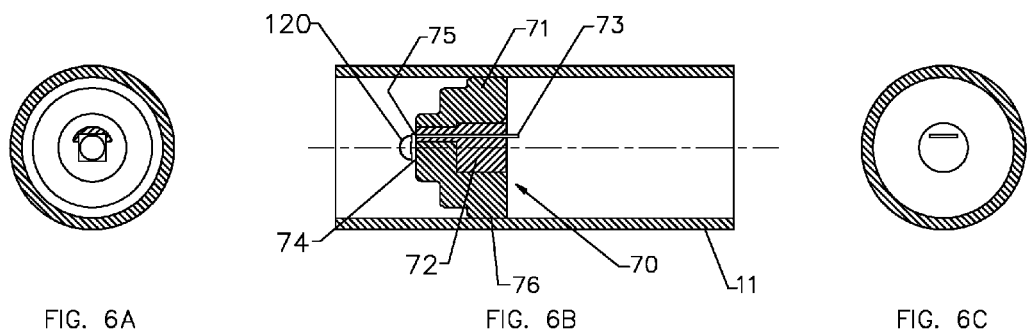
FIG. 6A  FIG. 6B  FIG. 6C

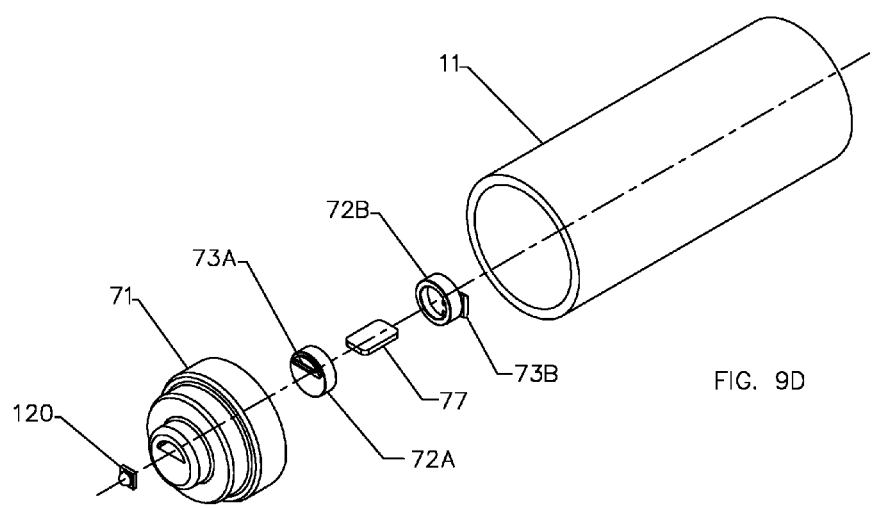
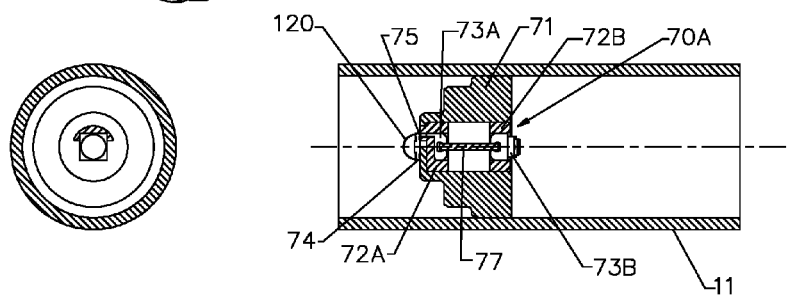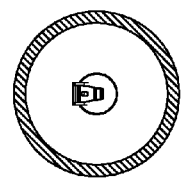
FIG. 9A
FIG. 9B
FIG. 9C

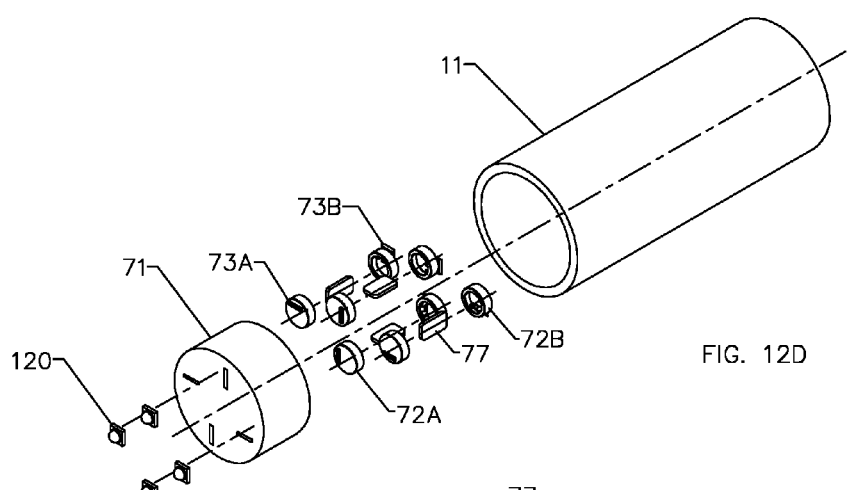
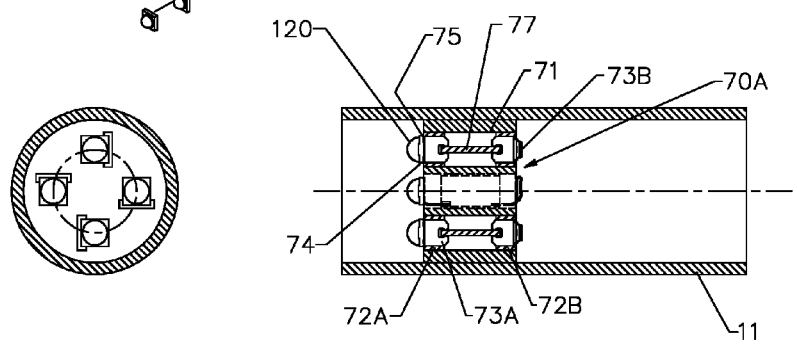
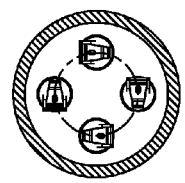
FIG. 12A FIG. 12B FIG. 12C
FIG. 12D

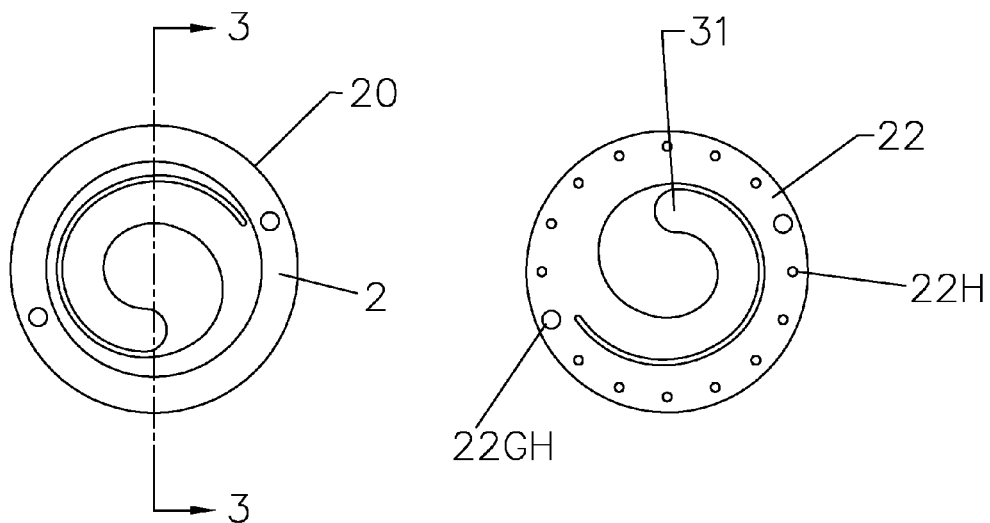
Fig. 22
Fig. 24
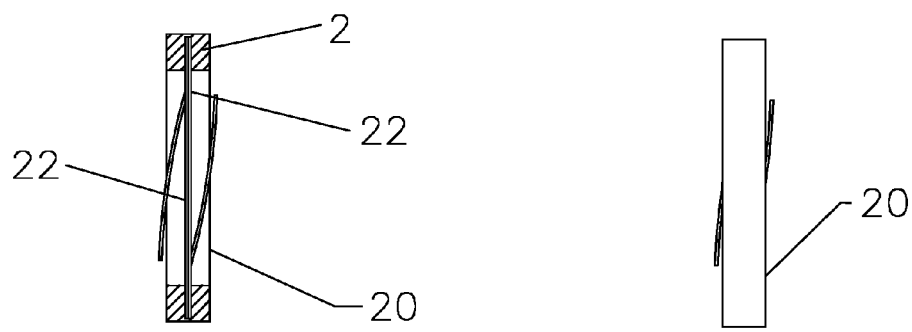
Fig. 23
Fig. 25

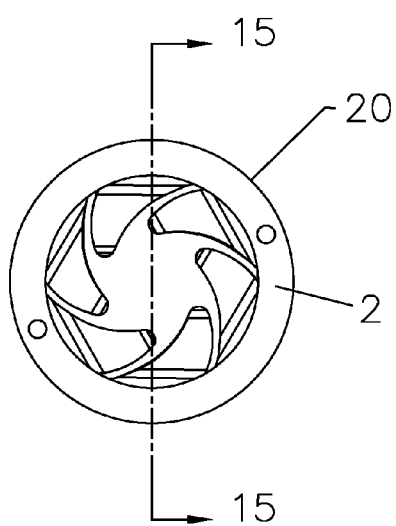
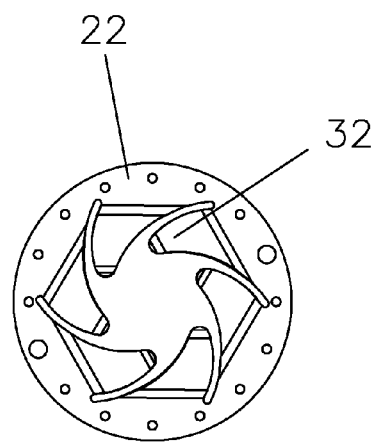
Fig. 34
Fig. 36
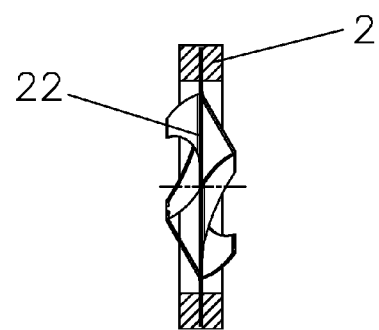
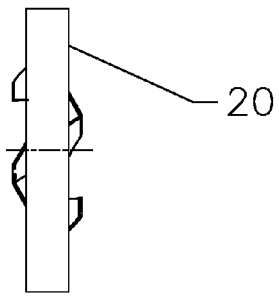
Fig. 35
Fig. 37

LED FLASHLIGHT WITH IMPROVED HEAT SINK AND BATTERY PROTECTION

CROSS REFERENCE TO RELATED APPLICATIONS

This application is a continuation-in-part application of U.S. Ser. Nos. 14/869,628 and 14/869,962, both of which were filed Sep. 29, 2015, and is also a continuation-in-part application of U.S. Ser. No. 14/971,971, filed Dec. 16, 2015, which is a non-provisional application which claims priority from U.S. Ser. No. 62/095,733, filed Dec. 22, 2014, the disclosures of all of which are specifically incorporated by reference herein in their entireties.

FIELD OF THE INVENTION

This application is in the field of flashlights that use light emitting diodes (LEDs) as light sources, and is especially concerned with flashlights with metal casings that use multiple batteries that are loaded into the flashlight barrel in series in which a positive terminal of one battery is in direct contact with a negative terminal of another battery.

BACKGROUND OF THE INVENTION

It is well known that LEDs give off heat during operation and that light output from an LED decreases with increasing LED die junction temperature. Accordingly, there is a well-recognized need for reducing LED die junction temperatures in LED flashlights to increase performance.

In designing a flashlight with an LED, there are two main battery sources available for powering one or more LEDs used as light sources—rechargeable and non-rechargeable batteries; increasing the number of batteries will increase the available voltage which can increase LED driver circuit efficiency.

Alkaline batteries have provided power to flashlights for decades. A general description of the construction of alkaline batteries is described in the prior art, an example of which is the article found at http://www.electrical4u.com/alkaline-batteries, as well as a technical bulletin about Duracell® batteries found at http://ww2.duracell.com/en-US/Global-Technical-Content-Library/Technical-Bulletins.jspx, both of which are incorporated by reference herein, from which FIG. 1 and the following description of such construction is obtained. The body of a battery, generally designated as 100, is made of a hollow steel can 102 comprised of an outer cylindrical wall 102OC, a top surface 102TC and a bottom surface 102BC. Can 102 contains all materials of the battery. A positive cap with a nipple 103 of battery 100 is projected from the top of can 102. A manganese dioxide cathode powder mix 104 is pressed against the inner steel wall of can 102 so that the steel case of the can becomes the cathode current collector and serves as the positive terminal of the cell. The inner surface of the thick layer of cathode mixture is covered with a porous separator 105 which isolates the electrodes of the battery. The central space, inside separator 105, is filled by a zinc anode powder 106. The porous nature of the anode, cathode, and separator materials allows them to be thoroughly saturated with the alkaline electrolyte solution. A metallic pin 107 is welded to the external anode cap 111 and extends through a plastic cap or grommet 109 into the center of the anode powder mix maintaining intimate contact. This pin is called a negative collector pin or an anode current collector. Plastic cap or grommet 109 is sealed to the steel can 102 by means of radial crimping pressure and a sealant. Anode cap 111 is electrically isolated from the positive cell case 102 with an insulator 110. A vent mechanism 112 is incorporated into the plastic grommet 109 to protect against cell rupture. An outer insulative wrapping 102W is also commonly applied to can 102 which is also used to contain printed material, such as trademarks and trade dress of the battery manufacturer.

However, despite the fact that alkaline batteries have been used in flashlights for decades, there has been a well-known problem that batteries can leak battery corrosive electrolyte over time, causing problems related to cleaning such leaks and sometimes ruining a flashlight in which the leak occurs. Accordingly, there is a long-felt need for a way to minimize battery corrosive electrolyte leaks in flashlights.

The present invention discloses and teaches a much improved LED flashlight, preferably with an outer metallic flashlight housing or barrel, which achieves superior performance through improved heat control of LED die junction temperature via an improved heatsink assembly while also minimizing battery corrosive electrolyte leaks, thus increasing reliability.

SUMMARY OF THE INVENTION

The present invention is generally directed to a flashlight having heatsink technology in which one electrically conductive contact of an LED package is electrically bonded to an inner electrically conductive member which is positioned and electrically isolated from an outer electrically conductive member by electrically insulating material and a second electrically conductive contact of the LED package (and an electrically neutral contact) is electrically bonded (such as by use of solder) to the outer electrically conductive member so that heat is transferred from an LED die within the LED package to the outer electrically conductive member and then to a thermally conductive outer casing with a thermal path in which thermal resistance is minimized while a tail cap is used to create a snug mechanical fit between a bottom surface of a metal can of a terminal battery held within the outer casing and a surface of the tail cap which may be a shock absorbing material that is compressed or an adjustable mechanical retention device such as a two piece tail cap in which an inner member can be driven by an outer member.

In other aspects of the present invention, for each pair of batteries held in series a spacer (which can be made of a shock absorbing material) is provided having a thickness sufficient to prevent the second end of a first battery from contacting the first end of a second battery while a resilient contact provides electrical contact between the second end of the first battery and the first end of the second battery. A tail cap resilient contact (such as a spring) can provide electrical contact between a battery terminal end and a tail cap contact point by applying a contact force on the terminal end of less than one pound when the flashlight is in a resting position and a minimum contact force of approximately half a pound.

Accordingly, it is a primary object of the present invention to provide improved heatsink technology while minimizing battery corrosive electrolyte leakage in devices in which batteries are held in a series configuration.

This and further objects and advantages will be apparent to those skilled in the art in connection with the drawings and the detailed description of the invention set forth below.

BRIEF DESCRIPTION OF THE DRAWINGS

FIG. 2 illustrates an LED package, such as a Cree® XLamp® XP-G2 LED, which constitutes prior art, and FIG. 2A is an exploded assembly view of FIG. 2.

FIGS. 3A-E illustrate a typical prior art LED assembly showing the LED soldered to a PC board. FIG. 3B is a cross sectional view which is shown exploded in FIG. 3E while FIGS. 3A and 3C are, respectively, top and bottom views looking into the apparatus shown in cross section in FIG. 3B, and FIG. 3D is an enlarged cutaway view of FIG. 3B.

FIGS. 4A-D illustrate a widely used prior art star type, metal and ceramic backed PC board to which the LED is mounted. FIG. 4B is a cross sectional view which is shown exploded in FIG. 4D while FIGS. 4A and 4C are, respectively, top and bottom views looking into the apparatus shown in cross section in FIG. 4B.

FIGS. 5A-D illustrate a heatsink assembly in accordance with the present invention installed in a metal tube or flashlight barrel. FIG. 5B is a cross sectional view which is shown exploded in FIG. 5D while FIGS. 5A and 5C are, respectively, top and bottom views looking into the apparatus shown in cross section in FIG. 5B.

FIGS. 6A-D illustrate a variation on the heatsink assembly shown in FIGS. 5A-D.

FIGS. 8A-D illustrate a variation on the heatsink assembly shown in FIGS. 5A-D in which a printed circuit board (PCB) is held within the heatsink assembly.

FIGS. 9A-D illustrate a variation on the heatsink assembly shown in FIGS. 6A-D in which a PCB is held within the heatsink assembly.

FIGS. 11A-D illustrate a circular array of LEDs mounted on a common heatsink assembly. Four LEDS are shown, but there could be any number of LEDs. FIG. 11B is a cross sectional view which is shown exploded in FIG. 11D while FIGS. 11A and 11C are, respectively, top and bottom views looking into the apparatus shown in cross section in FIG. 11B.

FIGS. 12A-D illustrate a variation on the heatsink assembly shown in FIGS. 11A-D in which PCBs are held within the heatsink assembly.

FIG. 13B is a cross sectional view of a single LED and FIGS. 13A and 13C are, respectively, top and bottom views of a linear array of four LEDs.

FIGS. 15 and 16 are block diagrams of a heatsink mounted LED with positive and negative polarity heatsinks, respectfully, while

FIGS. 19A-B illustrate a process for manufacturing a heatsink assembly in accordance with the present invention in which solder is used to solder pads of an LED assembly to a top surface of an outer electrically conductive member to form a heatsink assembly while

FIG. 22 is a top view illustrating a first design of a shock absorbing spacer assembly in accordance with the present invention, FIG. 23 is a cross sectional view of FIG. 22, FIG. 25 is a side view of FIG. 22 and FIG. 24 illustrates a resilient contact used in the assembly of FIG. 22.

FIG. 34 is a top view illustrating a fourth design of a shock absorbing spacer assembly in accordance with the present invention, FIG. 35 is a cross sectional view of FIG. 34, FIG. 37 is a side view of FIG. 34 and FIG. 36 illustrates a resilient contact used in the assembly of FIG. 34.

FIG. 44 illustrates a flashlight with the shock absorbing spacer of FIG. 22 while

FIG. 47 is an end view of the outer member of FIG. 46 while FIG. 50 is an end view of the inner member of FIG. 49 while

FIG. 53 illustrates the inner member of FIG. 49 screwed into the threads of a flashlight barrel with the male and female splines of inner and outer tail cap members of FIGS. 46 and 49 engaged while

FIG. 55 is an assembled two piece tail cap, illustrated in FIGS. 46 and 49, except that a shock absorbing material 202 has been added to the inner member while

FIG. 59 illustrates a replacement tail cap with a terminal end shock absorber in accordance with the present invention while

FIG. 61 illustrates a second replacement tail cap with a terminal end shock absorber in accordance with the present invention while

DETAILED DESCRIPTION OF THE INVENTION

Figure 1:
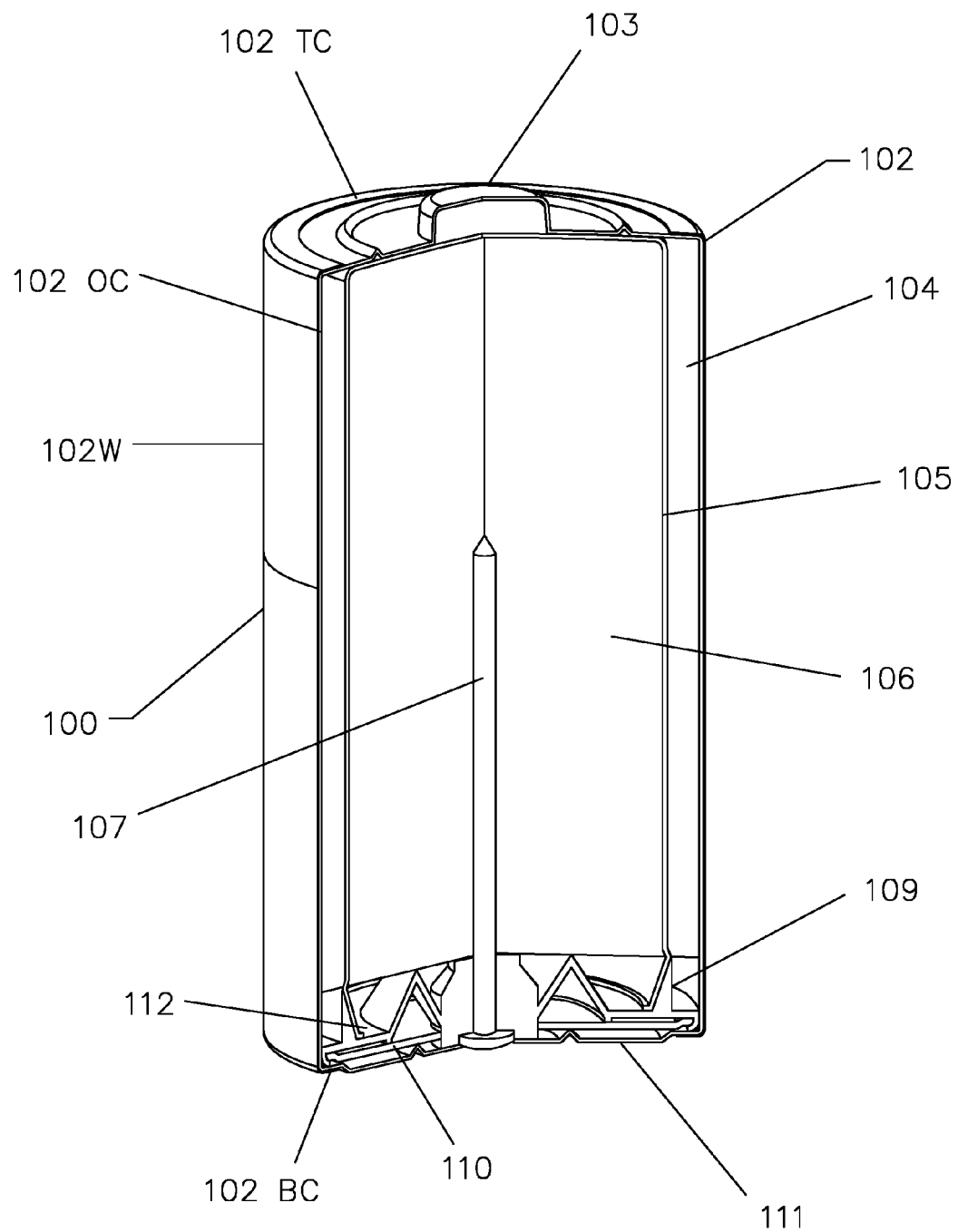
FIG. 1 illustrates a cutaway view of a Duracell® cylindrical alkaline battery which constitutes prior art.
Figure 3E:
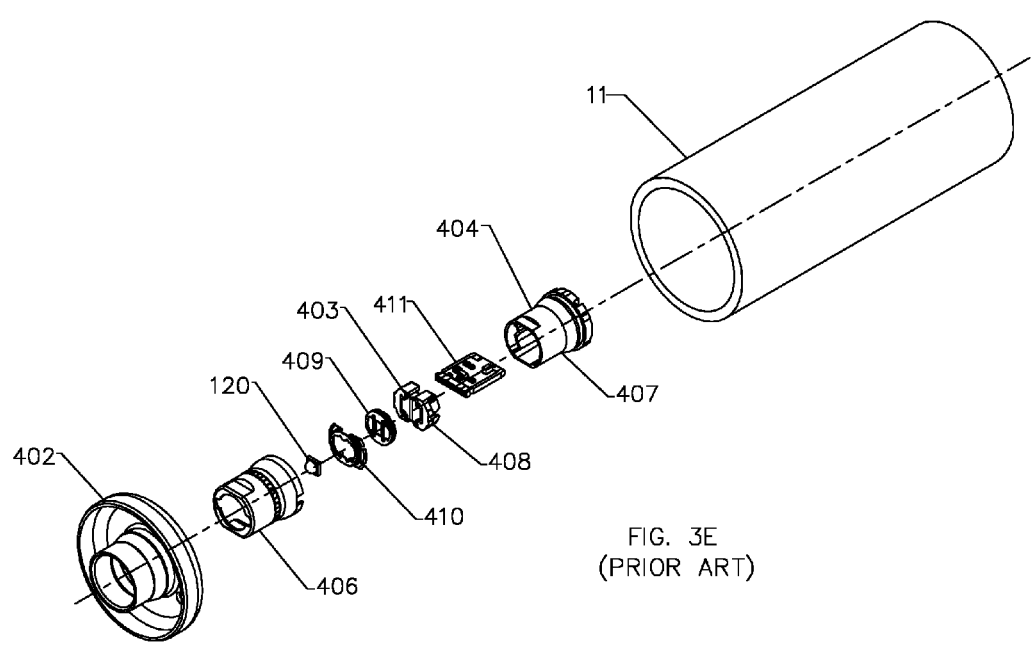

In the Figures and the following detailed description, numerals indicate various physical components, elements or assemblies, with like numerals referring to like features throughout both the drawings and the description. Although the Figures are described in greater detail below, the following is a glossary of elements identified in the Figures.
1 flashlight
2 shock absorbing spacer
11 barrel of flashlight 1
11A shoulder of barrel 11
11AT top surface of shoulder 11A
11B nut
11T thread of barrel 11
12 head of flashlight 1
13 light source of flashlight 1
14 tail cap of flashlight 1
20 shock absorbing spacer assembly
22 resilient contact
22H hole in resilient contact 22
22GH guide hole in resilient contact 22
26E ear of resilient contact 22
27E ear of resilient contact 22
31 curling arm of resilient contact 22
32 ear of resilient contact 22
40 spring
41 lock ring
42 lip seal
50 tail cap
51 outer member of tail cap
52 thread of member 51
53 knurl
54F female spline
55 spring contact
57 central bore
61 inner member of tail cap
62 thread of member 61
64M male spline
65 battery can engaging surface
70 heatsink assembly
70A heatsink assembly with PCB held in core material
71 outer electrically conductive member of heatsink assembly 70
71T top surface of outer electrically conductive member 71
72 core of an electrically insulating material of heatsink assembly 70
72A upper portion of core of an electrically insulating material of heatsink assembly 70A
72B lower portion of core of an electrically insulating material of heatsink assembly 70A
73 inner electrically conductive member of heatsink assembly 70
73A upper portion of inner electrically conductive member of heatsink assembly 70A
73B lower portion of inner electrically conductive member of heatsink assembly 70A
73T top surface of inner electrically conductive member 70
74 thermal junction and electrical connection between LED package 120 and outer electrically conductive member 71
75 electrical connection between LED package 120 and inner electrically conductive member 73
76 thermal junction between outer electrically conductive member 71 and barrel 11
77 printed circuit board
100 battery
100(1) first of two batteries in a series configuration
100(2) second of two batteries in a series configuration
102 can
102BC bottom surface of can 102
102OC outer cylindrical wall of can 102
102TC top surface of can 102
102W battery wrap
103 positive cap with nipple
104 cathode powder
105 porous separator
106 anode powder
107 negative collector pin or anode current collector
109 plastic cap or grommet
110 electrical insulator
111 anode cap
112 vent mechanism
120 LED package
121 LED die of LED package 120
122 silicon sub-mount of LED package 120
123 heat conductive material of LED package 120
124 wire bond of LED package 120
125 contact pad of LED package 120
126 contact pad of LED package 120
127 contact pad of LED package 120
128 outer casing of LED package 120
129 clear dome of LED package 120
200 tail cap assembly
201 spring
202 shock absorbing material
203 tail cap
300 tail cap assembly
301 modified shock absorbing spacer
302 spring
303 tail cap
402 heatsink
403 insulator
404 contact for supplying power to PCB
406 housing
407 insulator
408 contact for connecting PCB 111 to PCB 109
409 multilayered PCB
410 ring contact
411 PCB
426 first power connection
427 second power connection
428 star PCB
500 face cap
501 O-ring
502 lens
503 reflector
504 threaded nut
505 retaining ring
506 O-ring
508 O-ring
509 internal snap ring
510 actuator
511 switch port seal
512 switch
S1 solder
S2 solder The present invention is generally applicable to many different types of lighting devices, an especially preferred embodiment of which is flashlights having an outer metallic casing, examples of which are described in U.S. Pat. Nos. 6,361,183 and 8,366,290, the disclosures of which are specifically incorporated by reference herein, so the invention will now be illustrated by use of such an especially preferred embodiment without limiting the invention solely to such an embodiment.

Metallic flashlights have been using one or more light emitting diodes ("LEDs") as a light source for a number of years. LEDs can be purchased from a number of suppliers, one example of which is Cree, and for purposes of illustration, Cree® XLamp® XP-G2 LEDs can be used as suitable LEDs.

An LED useful in the present invention is illustrated in FIGS. 2 and 2A, in which an LED package 120 has an LED die 121 located on top of a silicon sub-mount 122 which is located atop a heat conductive material 123 while the bottom of LED package 120 has three contact pads 125, 126 and 127, heat conductive material 123 being held within an outer casing 128, there being a clear dome 129 placed around and above die 121. One of contact pads 125 and 127 is a positive contact pad, the other is a negative contact pad, while contact pad 126 is neither a negative or positive pad, but does allow for transfer of heat from die 121 through heat conductive material 123 outside of LED package 120 via pad 126. The positive and negative contact pads (125, 127) are electrically connected to die 121 via two wire bonds 124. The details of the sub-construction of LED package 120 are not critical to the present invention, and die 121, sub-mount 122 and heat conductive material 123 might be manufactured by a process in which they are integrally formed on a wafer; similarly, the details of how the positive and negative contact pads of LED package 120 are electrically isolated from one another are not critical to the present invention and a variety of different LED package structures might be suitable for use with the present invention, including LED package structures with five or more contact pads. What is important is that there are positive and negative electrically conductive members to provide power to cause a die within the LED package to emit light and that any heat removal mechanism within the LED package can be thermally connected to an outer electrically conductive member of a heatsink assembly 70, as explained below.

Figure 7D:
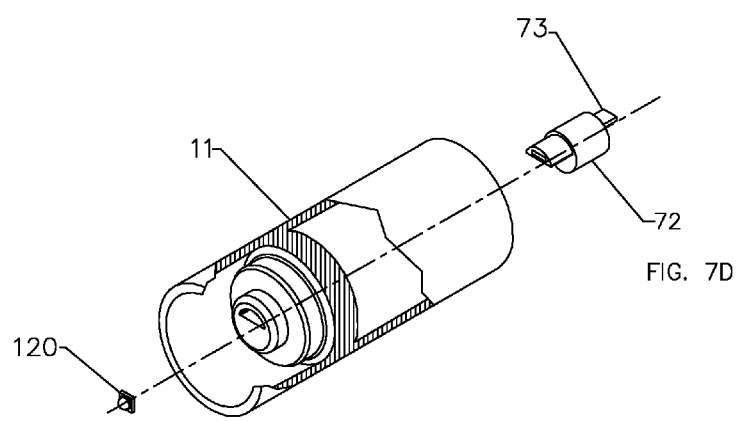
FIGS. 7A-D illustrate a variation on the heatsink assembly shown in FIGS. 5A-D in which a portion of the heatsink assembly is integrally formed with the flashlight barrel.
Figure 7A:
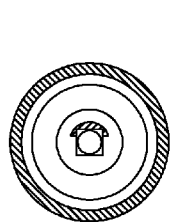
Figure 7B:
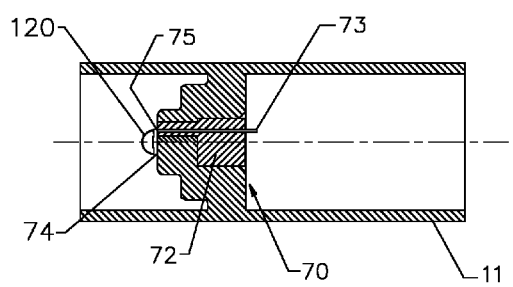
Figure 7C:
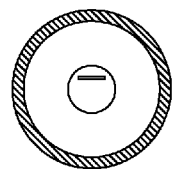
Figure 8A:
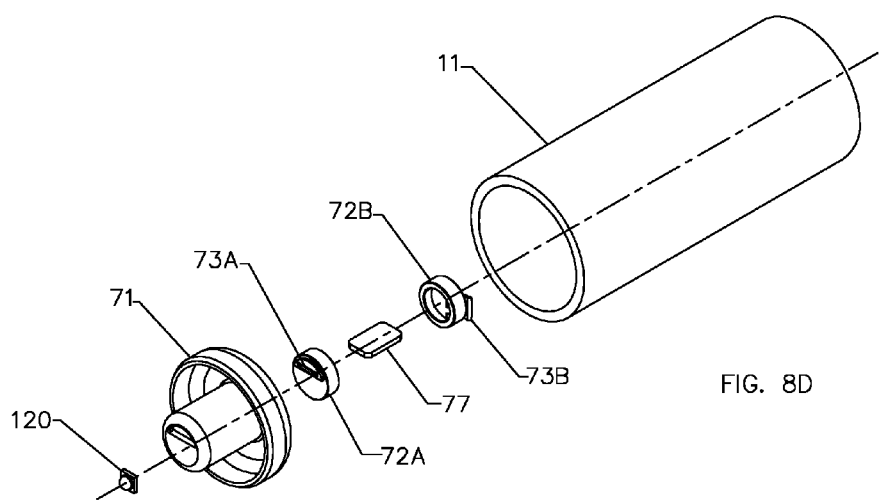
Figure 8B:
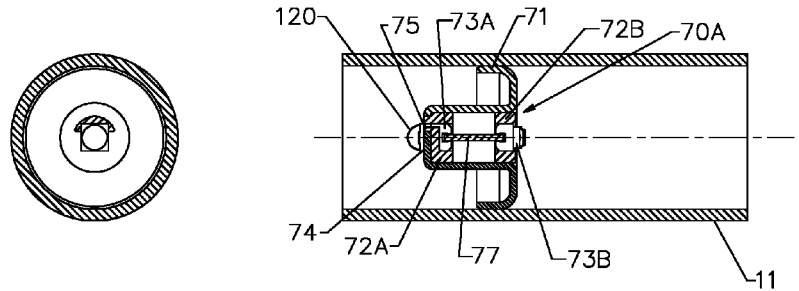
Figure 8C:
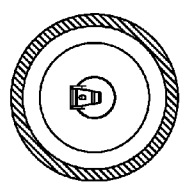
Figure 10D:
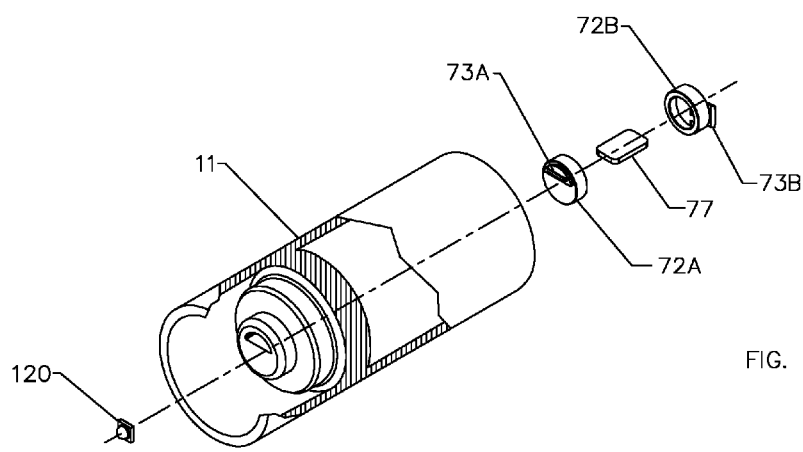
FIGS. 10A-D illustrate a variation on the heatsink assembly shown in FIGS. 7A-D in which a PCB is held within the heatsink assembly.
Figures 10A, 10B, 10C:
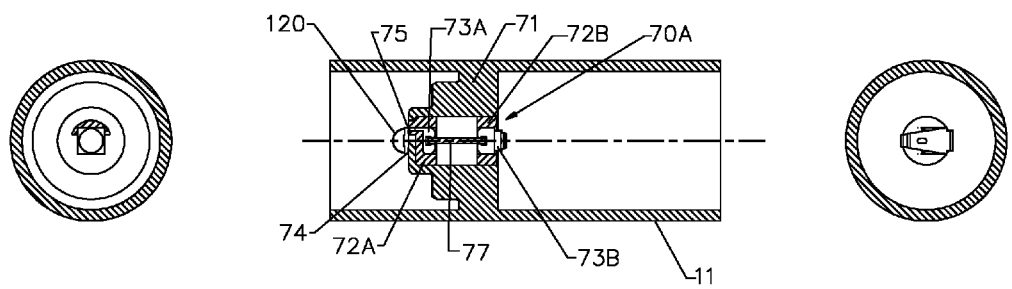
Figure 11A:
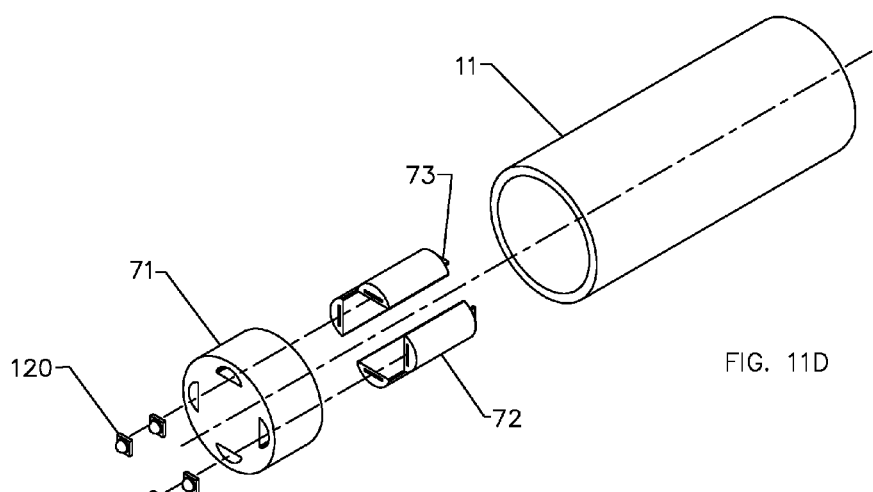
Figure 11B:
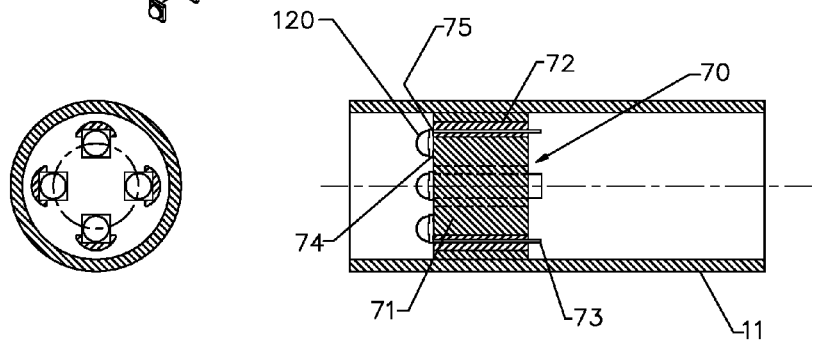
Figure 11C:
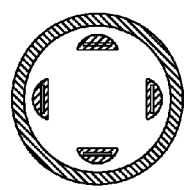
Figure 13A:
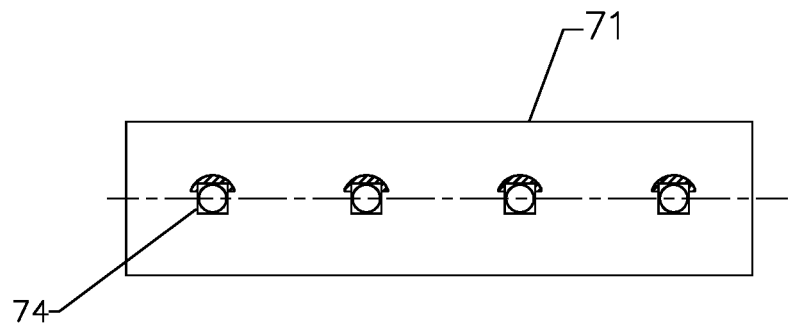
FIGS. 13A-C illustrate a linear array of LEDs mounted on a common heatsink assembly. Four LEDs are shown, but there could be any number of LEDs.
Figure 13B:
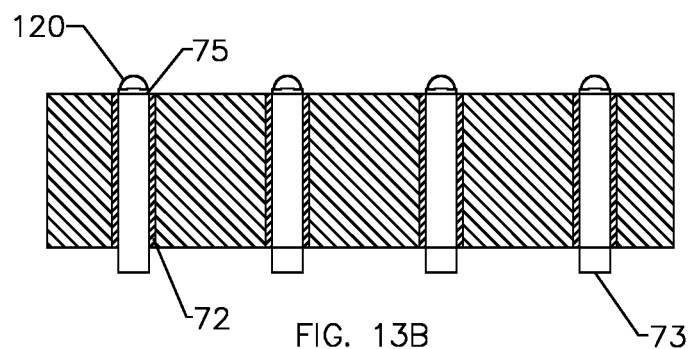
Figure 13C:
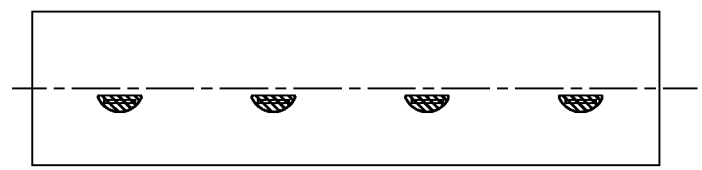
Figure 14A:
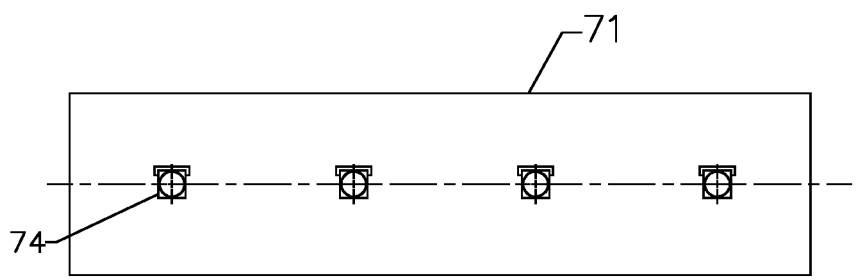
FIGS. 14A-C illustrate a variation on the heatsink assembly shown in FIGS. 3A-13C win which PCBs are held within the heatsink assembly.
Figure 14B:
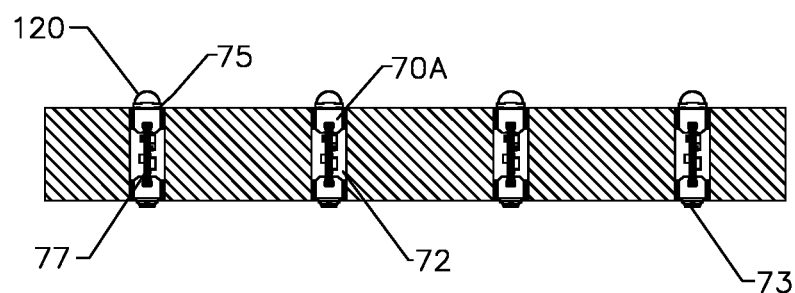
Figure 14C:
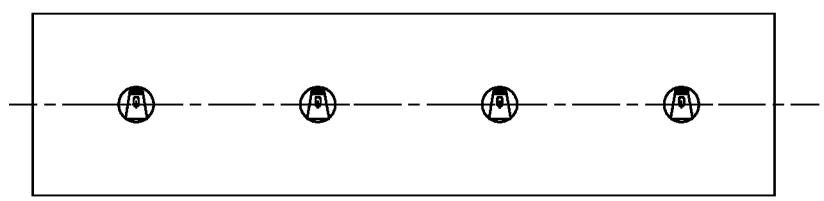
Figure 15:
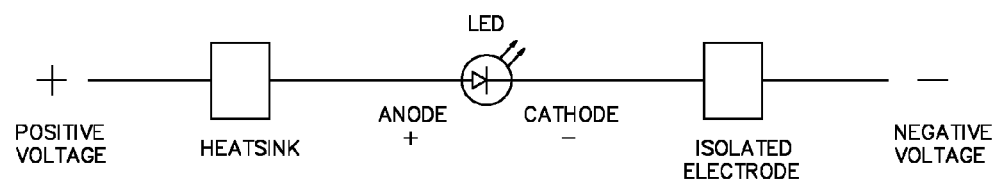
Figure 16:
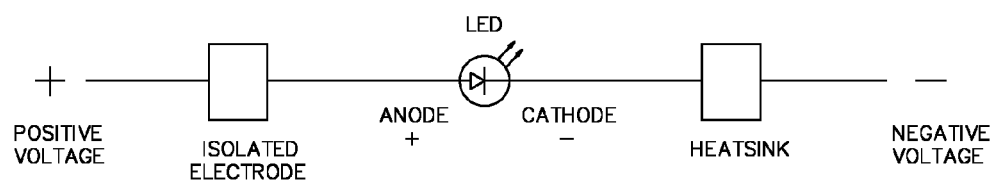
Figure 17:
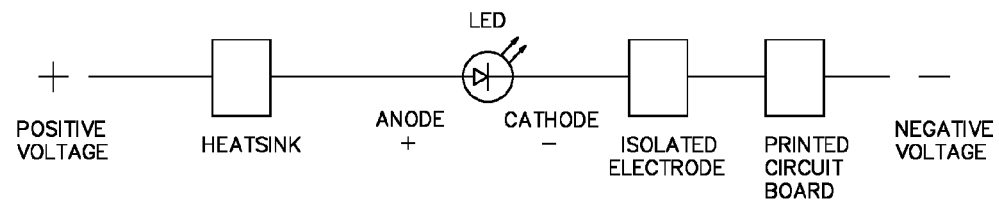
FIGS. 17 and 18 illustrate the same heatsink mounted LED positive and negative polarity heatsinks that incorporate a PCB with LED drive electronics.
Figure 18:
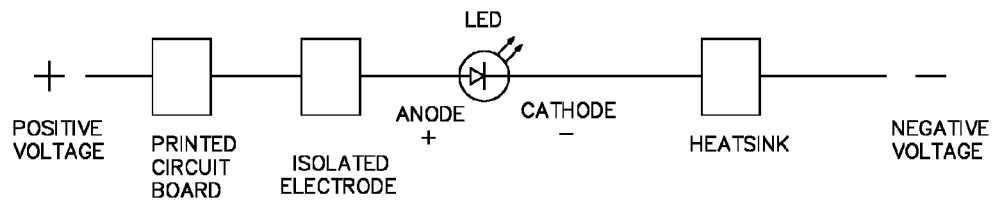

Heatsink assembly 70 according to the present invention has three main parts—an outer electrically conductive member 71 that is thermally conductive and which is mechanically connected to an outer casing of a lighting apparatus (e.g., a barrel 11 of a flashlight 1), a core 72 of an electrically insulating material which is held within outer electrically conductive member 71 and one or more inner electrically conductive members 73 which is/are positioned and electrically isolated from outer electrically conductive member 71 by core 72. It is especially preferred that outer electrically conductive member 71 maintains thermal and mechanical connection to barrel 11 by a mechanical contact (such as a press fit, nut and thread connection, or some other mechanical means) or by being integrally formed with barrel 11 (see FIG. 7B).

An LED package 120 is thermally and electrically connected to heatsink assembly 70 so that LED package 120 is turned on when power from an electrical circuit is applied to outer electrically conductive member 71 and inner electrically conductive member 73 and it is especially preferred that this be accomplished by bonding outer electrically conductive member 71 to a first of positive and negative contact pads 125, 127 and pad 126 while also bonding inner electrically conductive member 73 to the second of positive and negative contact pads 125, 127, it also being especially preferred that such bonding be solder bonding. If outer electrically conductive member 71 is not integrally formed with barrel 11, once heatsink assembly 70 is formed by completing said solder bonding, it is inserted into barrel 11 so that it is held by mechanical contact with barrel 11 and a thermal path is created between at least one contact pad of LED package 120 which is bonded to electrically conductive member 71 and barrel 11 which has a first thermal junction 74 between said at least one contact pad of LED package 120 and outer electrically conductive member 71 and a second thermal junction 76 between outer electrically conductive member 71 and barrel 11 (see FIG. 5D) whereas if outer electrically conductive member 71 is integrally formed with barrel 11, the thermal path created between at least one contact pad of LED package 120 which is bonded to electrically conductive member 71 and barrel 11 only has a first thermal junction 74 (see FIG. 7B). Minimizing the number of thermal junctions between LED package 120 and barrel 11 helps to minimize thermal resistance.

Outer electrically conductive member 71 serves as the heatsink component of heatsink assembly 70 and its top surface 71T (see FIG. 5A) provides a mounting surface for LED package 120. The anode or cathode contact pad of LED package 120, and in some cases a dedicated thermal pad (e.g., 126 of FIG. 2A), is bonded to top surface 71T by soldering or some other thermally and electrically conductive method or material while the electrically opposite side of LED package 120 is bonded to top surface 73T of inner electrically conductive member 73. Heat generated by LED die 121 is conducted through sub-mount 122 to heat conductive material 123 to contact pad 126 where it is conducted through thermal junction 174 to outer electrically conductive member 71 and then either through thermal junction 76 (as in the case of FIG. 5B) or directly to barrel 11 (as in the case of FIG. 7B) to ambient air. LED package 120 runs much cooler and more efficiently in this system than is possible when LED package 120 is mounted on printed circuit boards (such as is shown in FIGS. 3A-4D) because of lower thermal resistance of the system. Thermal resistance is a heat transferring property of an overall system irrespective of the source of heat which is measured in the system's increase in temperature per unit of conducted heat energy, such as ° C./W.

FIGS. 5A through 14C depict variations on the inventive design already described. As shown, heatsink assembly 70 can be of different shapes depending upon the application. Heatsink assembly 70 can also support multiple LED packages 120 in a variety of configurations; a circular array and a linear are only two of many possibilities. When multiple LED packages 120 are used with a single heatsink assembly 70, multiple inner electrically conductive members 73 can be used, one for each LED package 120, or multiple LED packages 120 can be bonded to a single inner electrically conductive member 73. Electronics with a suitable interconnect method can also be suspended in insulating core 72. It is also possible in all cases to provide electrically insulating material that positions and electrically isolates two electrically conductive members that extend out of the end opposite from LED package 120 to provide electrical connection points. In these cases the cathode and anode LED package pads are bonded to corresponding isolated pads and the LED package thermal pad is bonded to electrically conductive member 71.

The improved heatsink assemblies illustrated in FIGS. 5A through 14C do not utilize a PC board for mounting a LED package 120; instead, LED package 120 is mounted directly to metal top surface 73T of inner electrically conductive member 70. This method produces much improved heat transfer and a cooler operating, higher lumens LED package 120, compared to PC board mounted LED designs.

The present invention provides a direct efficient path to conduct heat away from an LED to ambient air outside of a flashlight or any other lighting device such as a headlamp, lantern or spotlight, as well as all types of area lighting that utilize high powered LEDs as a light source. Other heatsinking methods produce thermal paths that include a large number of thermal junctions, some of which have poor thermal conductivity or high thermal resistance. Examples of prior art heatsinking methods are illustrated in FIGS. 3A through 4D. Unique to the present invention is the ability to solder the heatsink component, which is outer electrically conductive member 71, directly to the electrical and thermal pads of LED package 120. No thermal grease or adhesives are required. In other designs heatsinking and electrical contact pads are on a PC board which results in more, less efficient, thermal junctions and longer, smaller cross section, thermal paths to ambient air. The use of thermal grease and adhesives in these less efficient designs helps heat transfer to some degree but not to the level of attaching the LED package directly to the heatsink assembly. The result of the much improved heat transfer possible with the invention is that the LED package operates much cooler and therefore much more efficiently. Higher lumens are possible with no increase in power over conventional systems. It is also possible to maintain lumens at the same level as other less efficient systems but consume far less power. This is especially important in battery powered lighting systems as on-time is extended without reducing lumens.

It is worth noting that the efficiency of the present invention can be increased or optimized, with the aid of the present disclosure, by increasing or maximizing the surface area exposure between the heatsink component of the heatsink assembly and the thermally and electrically conductive outer casing while also designing the heatsink component to have a sufficient mass to effectively and efficiently conduct heat between the heatsink assembly and the outer casing. Thus, for example, heatsink component 71 in FIGS. 6A-D will have better results than heatsink 71 of FIGS. 5A-D, while FIGS. 7A-D illustrate an embodiment in which the heatsink component is integrally formed with the outer casing, which should result in better results than the heatsink component of FIGS. 6A-D.

It is also worth noting that the outer casing, which is illustrated in the exemplary embodiments depicted in FIGS. 5-12D as a tube or barrel, need not be thermally and electrically conductive over its entire outer surface, although an outer casing which is thermally and electrically conductive over its entire outer surface may achieve better results.

It is further worth noting that the advantages obtained by the more efficient cooling of one or more LEDs obtained by the present invention can be used to create a flashlight mode of increased lumens, or a flashlight mode with increased on-time, or one or more modes that alternate between such modes or combine elements of both such modes.

Figure 19A:
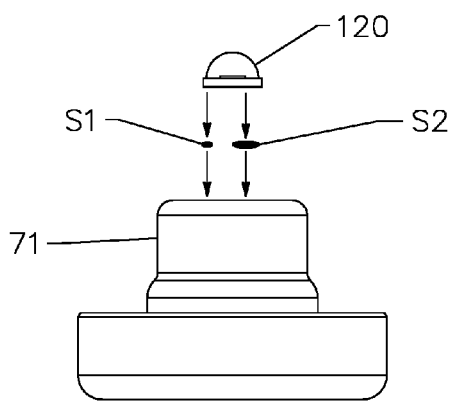
Figure 19B:
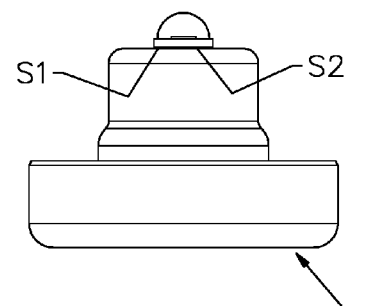
Figure 20A:
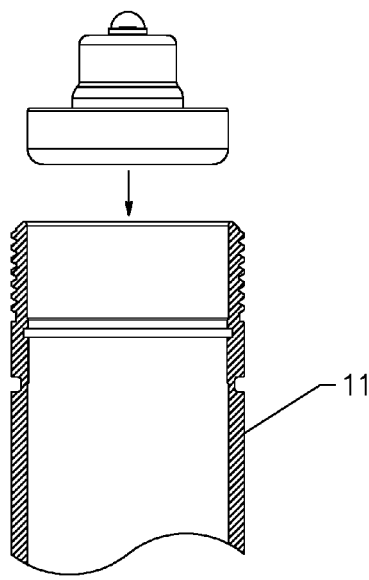
FIGS. 20A-B illustrate a press fit step of inserting a heatsink assembly into a tube or barrel.
Figure 20B:
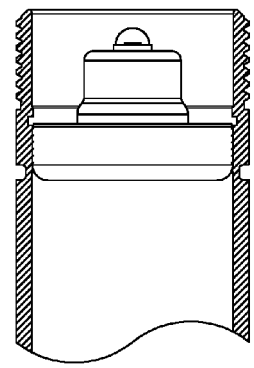
Figures 21A, 21B:
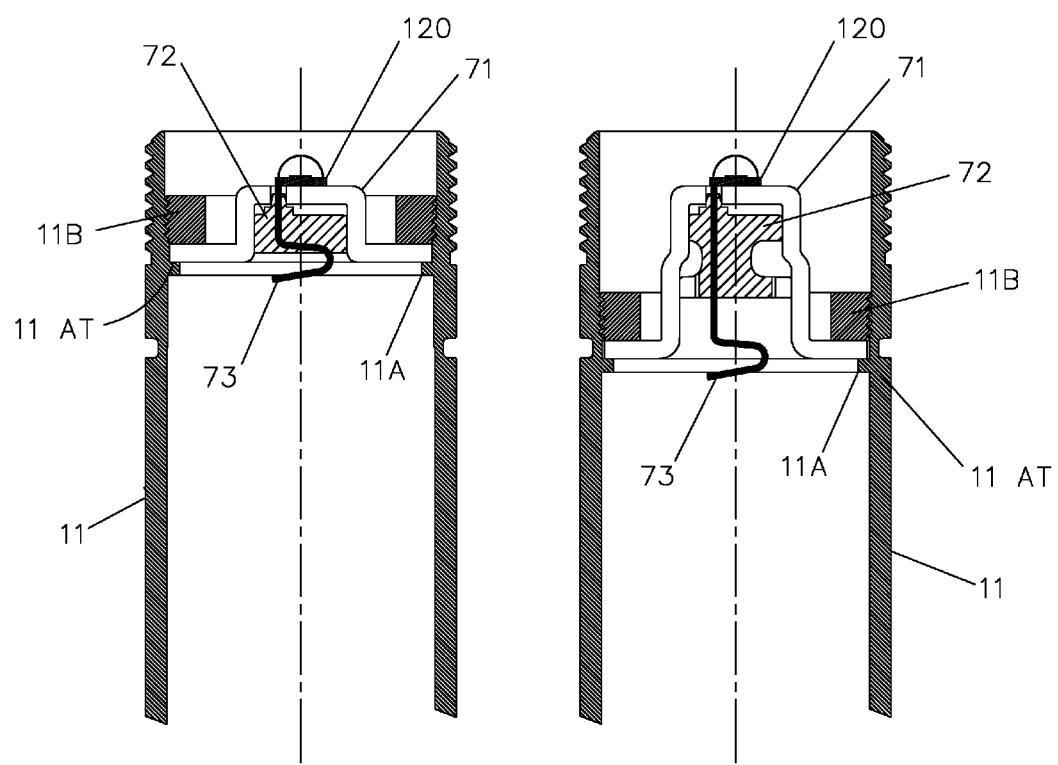
FIGS. 21A-B illustrate variations on FIGS. 20A-B in which the heatsink assembly is secured to a tube or barrel by use of mechanical retention means rather than a press fit.

The present invention lends itself to a more efficient, less costly, lighting device that can be manufactured economically through automation. In illustrative embodiments shown in FIGS. 19A-B and 20A-B, a heatsink assembly 70 is created by soldering two electrically conductive members of an LED package 120 to a top surface of heatsink component 71. Commercially available LEDs typically have three pads or more pads (see, e.g., FIG. 2A which illustrates three pads) which can all be used for soldering (solder S1 in FIG. 19A is for one pad whereas solder S2 in FIG. 19A is for two pads). After heatsink assembly 70 is created, it can be press fit into a tube or barrel 11 as illustrated in FIGS. 20A and 20B or it can be removably inserted into tube or barrel 11 and then be held in place by a removable holding mechanism, an example of which is nut 11B illustrated in FIGS. 21A and 21B. In the embodiments illustrated in FIGS. 21A and 21B, in an especially preferred embodiment, tube or barrel 11 and heatsink component 71 are made of aluminum, heatsink component 71 is coated with a metallic plating (e.g., nickel) that helps promote the soldering process, and a skin cut is made of the anodized aluminum where heatsink component 71 comes into contact with a top surface 11AT of shoulder 11A formed in tube or barrel 11 (so as to promote more efficient thermal heat transfer and for electrical conductivity). Also, it is especially desirable that heatsink assembly 70 be designed so that it can receive a reflector 503 (see FIG. 63) so that die LED package 120 is positioned within reflector 503 facing outwardly from a head end of barrel 11.

To demonstrate the lower thermal resistance obtainable by use of the heatsink technology of the present invention, tests were performed between different heat sink systems for use in a tube sized to accommodate a c-cell size battery. For each device under test (DUT), an LED package from the same family of LEDs was mounted on a heatsink system as noted below which was then pressed into a piece of aluminum of the same size and diameter to create the DUT, with the DUTs assembled as follows.

The UNI Module DUT used a heatsink system that corresponds to what is depicted in FIGS. 3A-E in which the heatsink module was pressed into aluminum which was then pressed into the tube of aluminum.

The Starboard DUT used a heatsink system that corresponds to what is depicted in FIGS. 4A-D in which the starboard was screwed onto a piece of aluminum with thermal grease located between the starboard and the piece of aluminum, and then this assembly was pressed into the tube of aluminum.

The 0.070" AL Molded DUT used a heatsink system that corresponds to what is depicted in FIGS. 5A-D in which outer electrically conductive member 71 is made out of aluminum with a thickness of 0.070 inches while the 0.070" Cu Molded DUT is the same heatsink system made out of copper instead of aluminum.

The Solid AL Molded DUT used a heatsink system that corresponds to what is depicted in FIGS. 6A-D while the Solid Cu DUT is the same heatsink system made out of copper instead of aluminum.

The DUTs were tested using the following testing methodology to obtain the test results set forth in Table 1:

Measure LED solder point temperature $\{T_{sp}\}$. A precision thermocouple (Type J or Type K) is placed directly adjacent to LED package on the surface of the heatsink.

DUT is powered from a digitally controlled power source at desired current level $\{I_{LED}\}$ and is recorded for later calculations DUT is powered on long enough for solder point temperature to stabilize (usually 30 to 45 minutes). Temperature is measured and logged using precision data acquisition instrument. Once peak temperature is observed, it is recorded as $\{T_{sp}\}$ Measure LED Forward Voltage $\{V_f\}$ at desired current level $\{I_{LED}\}$ when peak $\{T_{sp}\}$ is observed. The LED Voltage $\{V_f\}$ is measured using a precision volt meter connected directly to the LED solder pads Total LED Power Dissipation $\{P_d\}$ is calculated using equation 1. LED current $\{I_{LED}\}$ multiplied by measured LED Forward Voltage $\{V_f\}$.

Calculate thermal resistance $\{\Theta_{Rth}\}$ using equation 2. This is the total thermal resistance of the heat sink and flashlight barrel, from LED solder point $\{T_{sp}\}$ to ambient air $\{T_{amb}\}$ Obtain manufacturer's thermal resistance $\{\Theta_{RthLED}\}$ specification for the LED family being used. In this case, the Cree XM-L2 is 2.5° C./W.

Calculate LED junction temperature $\{T_j\}$ using equation 3. This is the temperature of LED die, also called LED junction.

Equations:

$$P_d = I_{LED} * V_f \quad \quad 1.$$

$$\Theta_{Rth} = (T_{sp} - T_{amb})/P_d \quad \quad 2.$$

$$T_j = (P_d * \Theta_{RthLED}) + T_{sp} \quad \quad 3.$$

Definitions of Variables and Constants:
$\Theta_{Rth}$=Calculated Thermal resistance of heat sink (overall thermal resistance, from $T_{sp}$ to ambient air $T_{amb}$) [° C./W]
$T_{sp}$=Solder point temperature (measured directly adjacent to LED substrate) [° C.] using thermocouple
$T_{amb}$=Ambient air temperature [° C.]
$P_d$=Total calculated dissipated power [W]
$I_{LED}$=LED drive current [A]
$V_f$=LED forward voltage [V]
$T_j$=Calculated LED Junction temperature [° C.]
$\Theta_{RthLED}$=Manufacturer specified thermal resistance of LED family [° C./W] XM-L2 LED: 2.5° C./W

TABLE 1

| Device Under Test (DUT) | $V_f$ [V] | $P_d$ [W] | $T_{sp}$ [° C.] | $\Theta_{Rth}$ [° C./W] | $T_j$ [° C.] |
| --- | --- | --- | --- | --- | --- |
| UNI Module | 3.16 | 9.48 | 164 | 14.66 | 187.7 |
| Starboard | 3.27 | 9.81 | 95 | 7.14 | 119.53 |
| Solid flat Al | 3.28 | 9.84 | 92 | 6.81 | 116.6 |
| .070" Al Molded | 3.29 | 9.87 | 87 | 6.28 | 111.68 |
| Solid Al | 3.29 | 9.87 | 86 | 6.18 | 110.68 |
| Solid Cu | 3.29 | 9.87 | 83 | 5.88 | 107.68 |
| .070" Cu Molded | 3.3 | 9.9 | 80 | 5.56 | 104.75 |

Constants
$T_{amb}$ = 25° C.
$I_{LED}$ = 3 A
$\Theta_{RthLED}$ = 2.5° C./W

In calculating the results set forth in Table 1, it was assumed that 100% of total power is dissipated as heat. This is the absolute worst case scenario because, in a real world application, only about 60-70% of the total power is dissipated as heat, while the remaining 30-40% is converted to photon energy (light), but it's nearly impossible to know the precise efficacy (ability to convert electrical power to photon energy) of each LED, so 100% power dissipation was used for the worst case scenario.

It should also be noted that tests were made on a heatsink system that corresponds to what is depicted in FIGS. 5A-D with a smaller thickness of aluminum of 0.050 inches, but the results of that test, while superior to the UNI Module DUT, were not superior to that of the Starboard DUT, thus emphasizing the need for ensuring that outer electrically conductive member 71 is sufficiently thick so as to efficiently conduct heat away from the LED package.

While a superior heatsink mechanism has now been described, which will increase the efficiency of LED lighting products, another area for improvement in existing lighting products, especially in terms of products used in situations where reliability is critical, and where multiple batteries are used as a power source in a series configuration, is minimizing battery corrosive electrolyte leakage.

Generally speaking, when two or more cylindrical batteries are held in a series configuration in a battery compartment, a top surface of each of the batteries has a nipple contact while the bottom surface of each of the batteries has a generally flat surface, and the top nipple contact is traditionally a positive or cathode contact while the bottom flat contact is traditionally a negative or anode contact. The battery compartment which holds the batteries in a series configuration traditionally has a top contact against which a first battery in the series is loaded and a compression spring that serves both as an electrical contact for the last battery in the series (hereinafter the terminal battery) and as a biasing means so as to keep the batteries in series held in electrical contact by biasing the bottom flat contact of the terminal battery toward the top contact.

Figure 63:
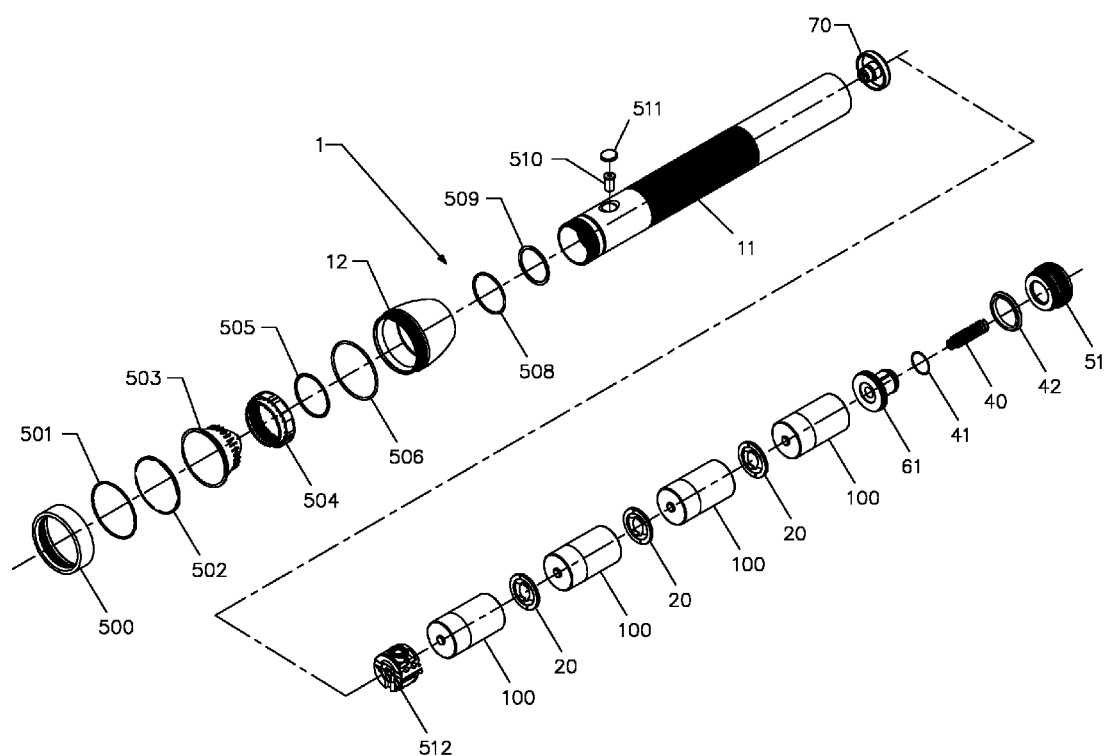
FIG. 63 illustrates an LED flashlight with an improved heatsink and battery protection in accordance with the present invention.

While the following aspects of the present invention are not limited to use with flashlights, and are applicable to any device with a battery compartment in which two or more batteries are held in a series configuration, the following aspects of the present invention will hereinafter again be described and illustrated, for ease of understanding, by reference to only one specific device—a flashlight, examples of which are described in U.S. Pat. Nos. 6,361,183 and 8,366,290, and FIG. 63 is but one preferred example of a flashlight in accordance with the present invention which utilizes a superior heatsink mechanism while also minimizing battery corrosive electrolyte leakage.

In a flashlight 1 the terminal battery is the last battery which is inserted into barrel 11 of the flashlight and the terminal battery is traditionally biased toward head 12 of the flashlight, which contains light source 13, by a compression spring included in a tail cap 14 which seals off the barrel after the batteries have been inserted and the tail cap is screwed on and into place.

While it is traditionally the case that the bottom flat contact of a first battery in a series configuration (which is inserted into a flashlight barrel before the next or second battery in a series configuration) is in both physical and electrical contact with a top nipple contact of the second battery in the series configuration, in accordance with one aspect of the present invention, such physical contact is prevented by a spacer made of shock absorbing material inserted between the first and the second batteries in the series configuration.

In an especially preferred embodiment of the present invention, a shock absorbing spacer 2 is configured as a disc which has a circular outer cross section which is of substantially the same diameter as the diameter of the two cylindrical batteries it is inserted between and an inner cross section which is of substantially the same diameter as that of the bottom surface 102BC of the first battery and/or the top surface 102TC of the second battery. It is especially preferred that shock absorbing spacer 2 have a thickness sufficient so as to keep the top nipple contact of the second battery in the series configuration from coming into contact with the bottom flat contact of the first battery in the series configuration, even when the flashlight is subjected to extreme shock, such as, for example, being dropped from a distance of several meters, or more. Accordingly, the thickness of the shock absorbing spacer should be greater than the height of the nipple of the top nipple contact, and take into account variations in such height in various batteries, as well as any compression of the shock absorbing spacer when it is performing its shock absorbing function under anticipated or desired performance criteria. The shock absorbing spacer can be made of any material that absorbs shock, such as energy-absorbing plastic or rubber, and it is especially preferred that the material be a cushioning material that absorbs a proportion of the kinetic energy arising when the flashlight suffers impact or is dropped, while still having sufficient recovery that the shock absorbing spacer will continue to function over time.

Figure 45:
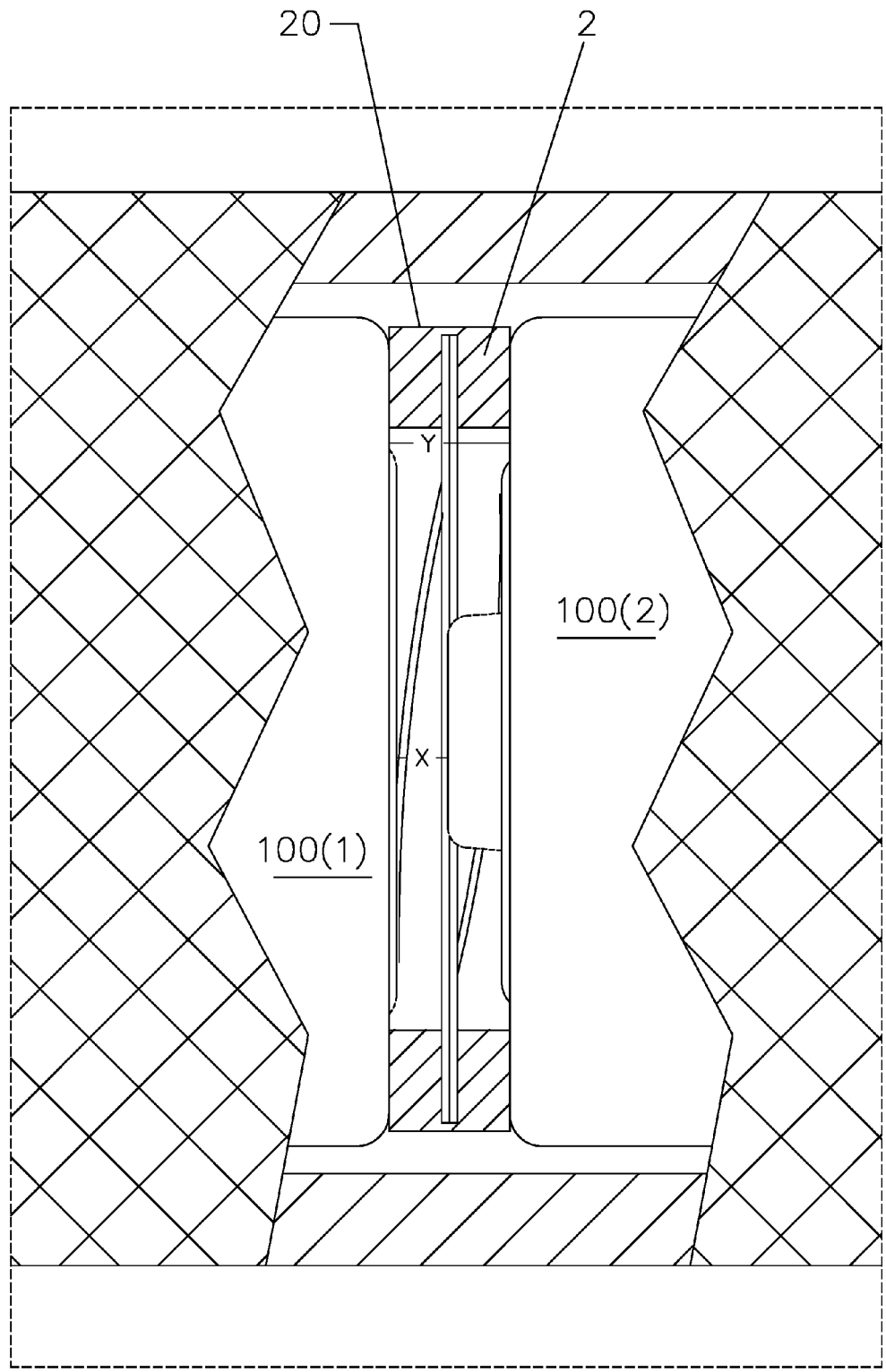
FIG. 45 is a close up view of a portion of FIG. 44.
Figure 46:
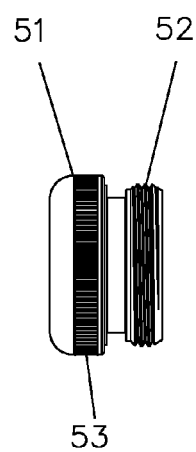
FIG. 46 illustrates an outer member of a tail cap that receives an inner member of a tail cap illustrated in FIG. 49 in accordance with the present invention.
Figure 47:
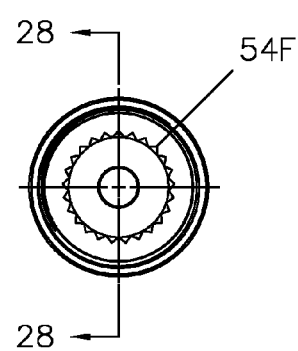
Figure 48:
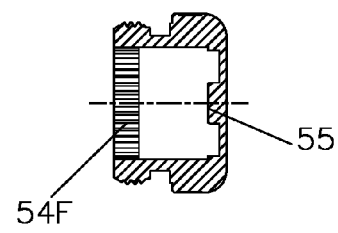
FIG. 48 is a cross sectional view of FIG. 47.
Figure 49:
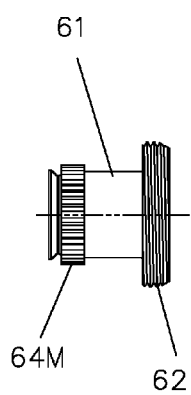
Figure 50:
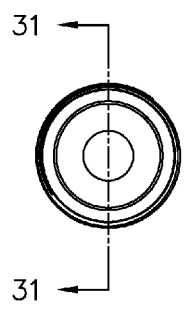
Figure 51:
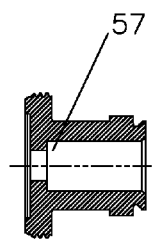
FIG. 51 is a cross sectional view of FIG. 50
Figure 52:
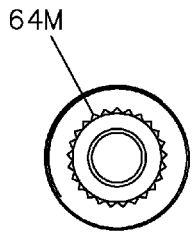
FIG. 52 is an end view looking at the back side of FIG. 51.

Because shock absorbing spacer 2 keeps the top nipple contact of the second battery in the series configuration 100(2) from coming into contact with the bottom flat contact of the first battery in the series configuration 100(1), the two terminals must be electrically connected, and, in an especially preferred embodiment of the present invention, this is done by at least one resilient contact held by the shock absorbing spacer in a shock absorbing spacer assembly 20, and the electrical contact with the top nipple contact is made with the base below the nipple, or outer diameter of the nipple (less preferably), but not the top surface of the nipple, as illustrated in FIG. 45 in which shock absorbing spacer 2 has a thickness of Y whereas the distance between the top nipple contact of the second battery 100(2) and the bottom flat contact of the first battery 100(1) is X. The reason it is especially preferred that the at least one resilient contact not contact the top of the nipple is that reliance on such contact would mean that shock absorbing spacer 2 would need to be thicker so that a shock would not allow energy to be passed from the nipple through the resilient contact to the bottom flat contact.

The at least one resilient contact can take on many different forms, some preferred embodiments of which are illustrated in FIGS. 24, 28, 32, 36, 38, 40 and 42.

In FIG. 24, resilient contact 22 is formed from stamped metal with a plurality of holes 22H, two guide holes 22GH, and a curling arm 31. Two mirror imaged contacts 22 are mounted opposite of each other (see FIG. 23), with their holes 22H and guide holes 22GH aligned, and then shock absorbing spacer 2 is molded so that its material fills holes 22H but leaves guide holes 22GH unfilled, for later use in assembly, to form shock absorbing spacer assembly 20.

Figure 26:
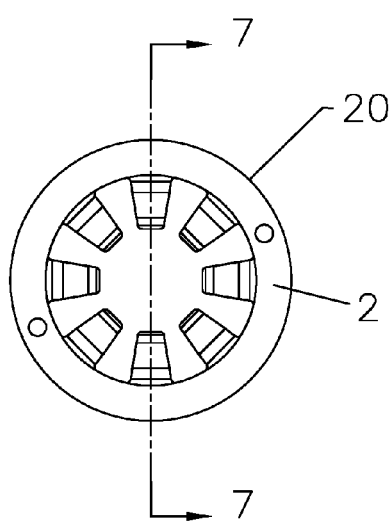
FIG. 26 is a top view illustrating a second design of a shock absorbing spacer assembly in accordance with the present invention.
Figure 28:
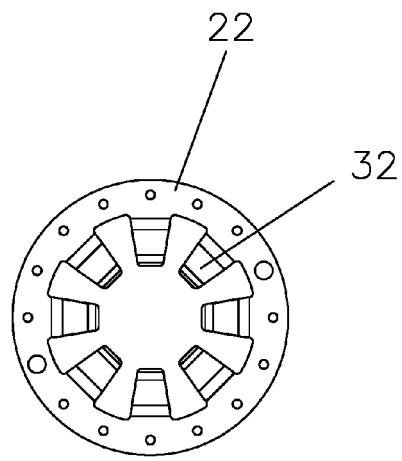
FIG. 28 illustrates a resilient contact used in the assembly of FIG. 26.
Figure 27:
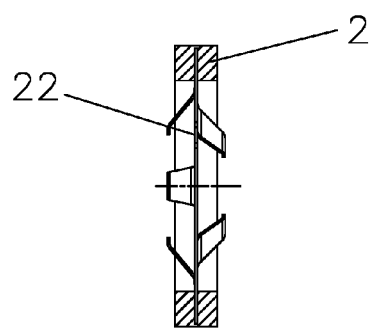
FIG. 27 is a cross sectional view of FIG. 26.
Figure 29:
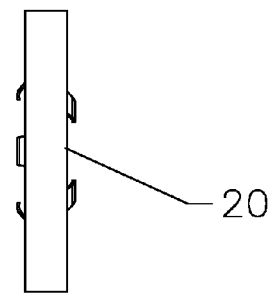
FIG. 29 is a side view of FIG. 26
Figure 30:
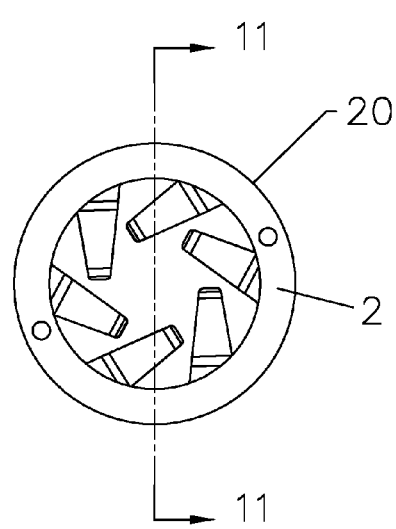
FIG. 30 is a top view illustrating a third design of a shock absorbing spacer assembly in accordance with the present invention.
Figure 32:
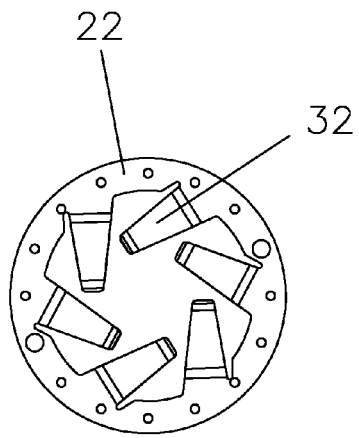
FIG. 32 illustrates a resilient contact used in the assembly of FIG. 30.
Figure 31:
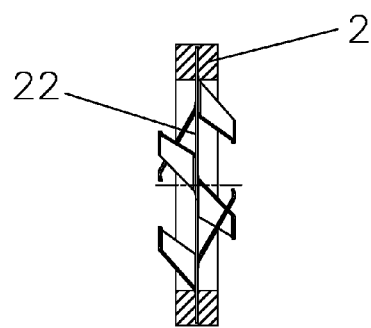
FIG. 31 is a cross sectional view of FIG. 30.
Figure 33:
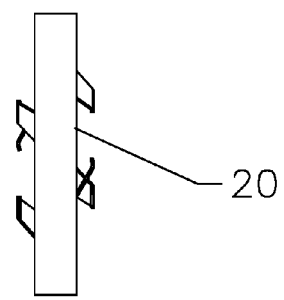
FIG. 33 is a side view of FIG. 30

In FIGS. 28, 32 and 36, a single resilient contact 22 is formed from stamped metal, but multiple ears 32 are bent in opposing directions as illustrated in FIGS. 27, 31 and 35, respectively, and the ears of the different embodiments have different configurations. A shock absorbing spacer 2 is molded around the single resilient contacts 22 to form the different embodiments of shock absorbing spacer assembly 20 illustrated in FIGS. 26, 30 and 34.

Figure 38:
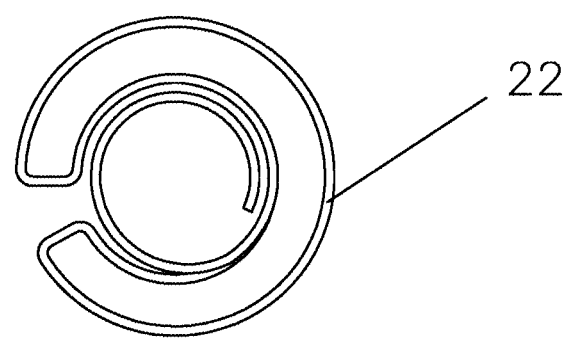
FIGS. 38, 40 and 42 each illustrate a spring design that can be used in a shock absorbing spacer assembly in accordance with the present invention as illustrated in FIGS. 39, 41 and 43, respectively.
Figure 39:
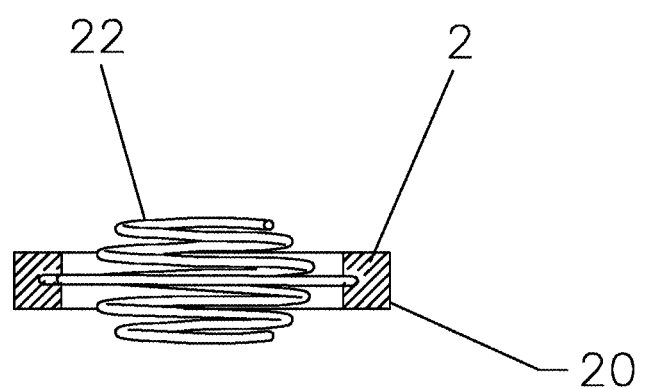
Figure 40:
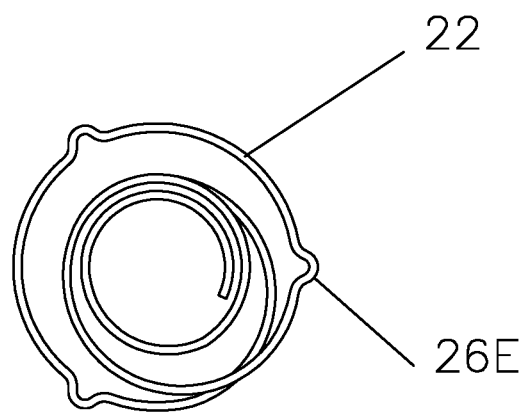
Figure 41:
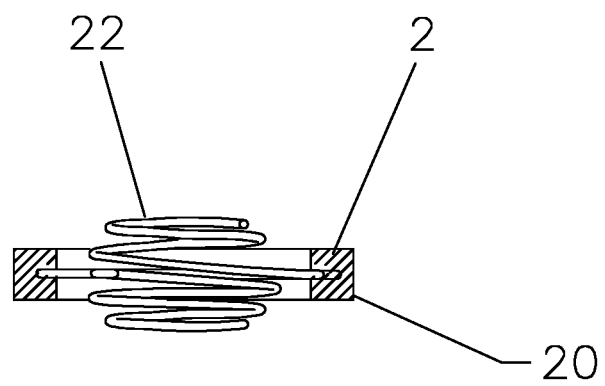
Figure 42:
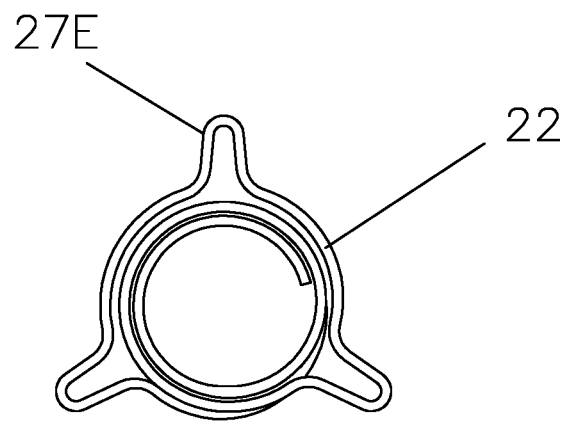
Figure 43:
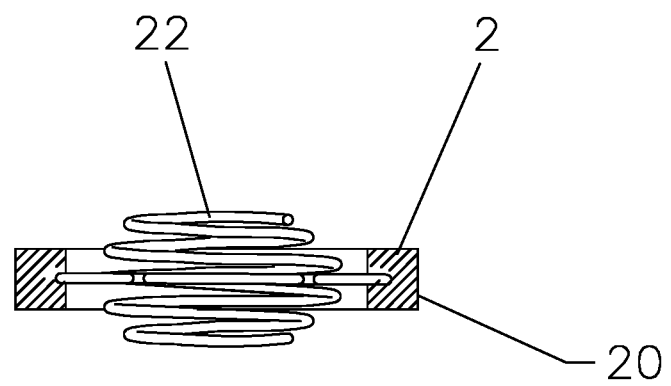
Figure 44:
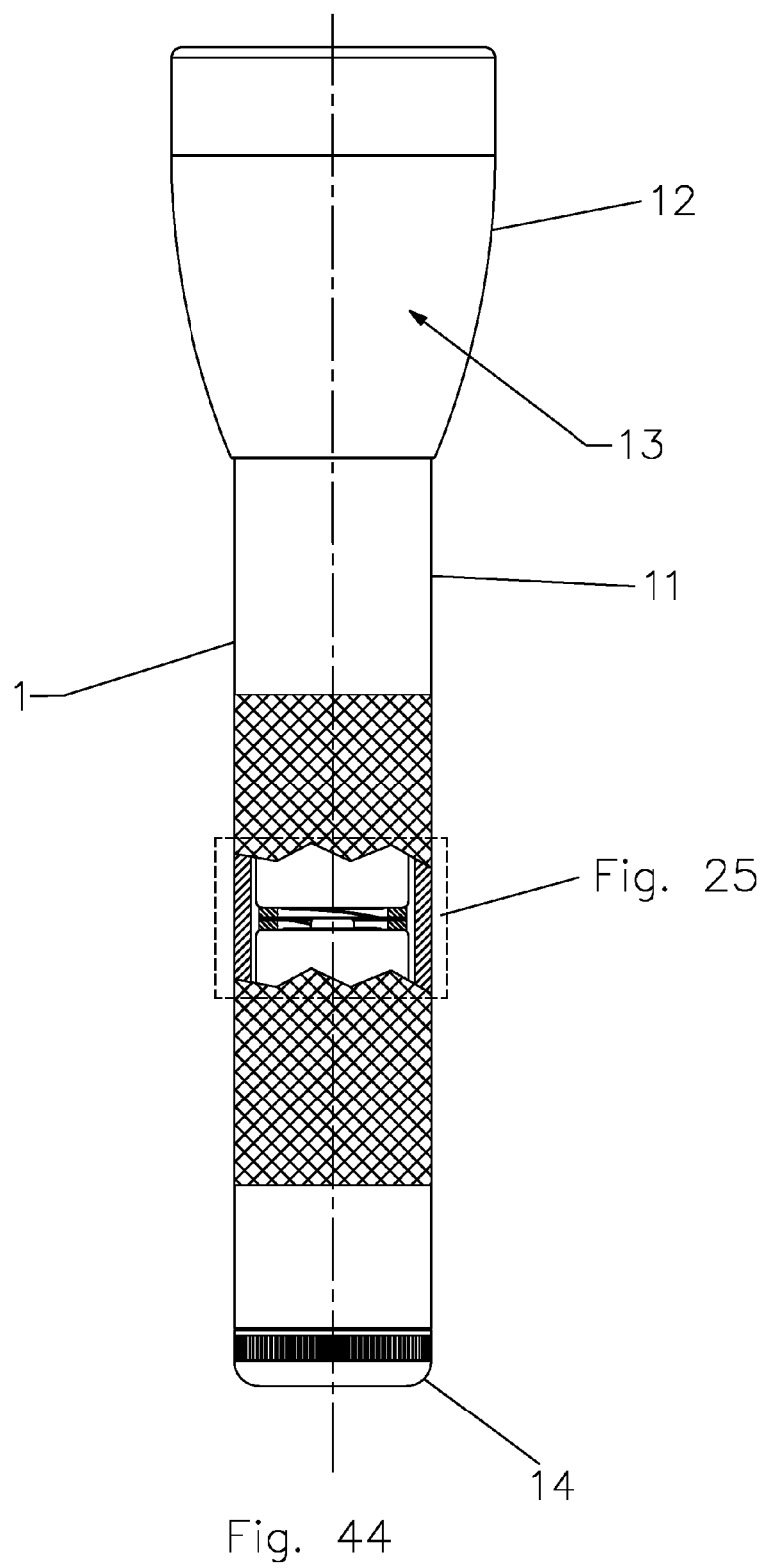

In additional embodiments, resilient contact 22 can be a spring, examples of shapes of which are illustrated in FIGS. 38, 40 and 42, and such springs can be secured within shock absorbing spacer 2 by molding to form shock absorbing spacer assemblies as illustrated in FIGS. 39, 41 and 43, respectively.

Shock absorbing spacer assemblies 20 can easily be dropped in between batteries as batteries are being loaded into a barrel 11 of a flashlight 1; one shock absorbing spacer assembly should be inserted between every two batteries; accordingly, a flashlight having two batteries in series will use one shock absorbing spacer assembly between the two batteries; a flashlight having three batteries in series will use two shock absorbing spacer assemblies between the first and second, and the second and third batteries; a flashlight having four batteries in series will use three shock absorbing spacer assemblies between the first and second, the second and third, and the third and fourth batteries, and so on, so that the number of shock absorbing spacer assemblies used in a barrel will equal one less than the number of batteries arranged in a series configuration. In view of the ease of such assembly, it is easy to see why it is especially preferred that shock absorbing spacer 2 and resilient contact 22 form a single assembly; however, resilient contact 22 could also be detached from shock absorbing spacer to accomplish the same functional purpose, albeit with the need for a more difficult assembly process.

Use of shock absorbing spacer assemblies 20 between two batteries in a series arrangement allows energy imparted during a shock to be absorbed by the shock absorbing spacer assemblies and also imparts substantially all of the shock between bottom surface 102BC of can 102 of the first battery and top surface 102TC of can 102 of the second battery in a series arrangement, rather than imparting shock to either bottom flat contact 111 of the first battery or top nipple contact 103 of the second battery.

In another aspect of the present invention, a terminal end shock absorber is positioned so that the terminal end of a terminal battery in a series configuration will be cushioned by the terminal end shock absorber when a force is applied to the series configuration causing the two or more cylindrical batteries to move toward a terminal retaining member (which is a tail cap 15 in flashlight 1).

In some situations, it may be possible to use a shock absorbing spacer 20 as a terminal shock absorber, depending upon how electrical contact is made with a tail cap, how the tail cap fits into a closed electrical circuit, and how much space there is between bottom flat contact 111 of the terminal battery and its contact point within the tail cap. In an especially preferred embodiment of the present invention, a specially designed tail cap assembly is used to provide a terminal end shock absorber.

Because many different devices make contact with the terminal end of a terminal battery in different ways, even in one device category, such as a flashlight, it is worth noting that sometimes a strong spring is used to make such contact; however, if one is designing a particular device, especially where cylindrical batteries are inserted into a cylindrical tube, one way to minimize the amount of stress that might be applied to the terminal end of the terminal battery is to insure a snug fit so there is less room for the batteries to move in the event of extreme shock.

One of the reasons why batteries may not enjoy a snug fit is variations in tolerance and production specifications/actual manufactured dimensions of batteries. As more batteries are aligned in a series configuration, there is a greater possibility of cumulative variations. In accordance with one aspect of the present invention, a snug fit is created by the combination of eliminating variations between pairs of batteries with a spacer (which can either be a shock absorbing spacer, as already disclosed, or a non-shock absorbing spacer having the same construction except for the use of a non-shock absorbing material) and then insuring a snug fit by creating a snug mechanical fit at the bottom surface of the can of the terminal battery. Use of spacers between adjoining battery terminals helps cancel variations in dimensions of the batteries because variations in positive cap 103 or anode cap 111 are no longer important since the spacer is held between bottom surface 102 BS of the first battery and top surface 102TC of the second battery, and the width of the spacer is greater than the nipple of positive cap 103. Accordingly, when a snug fit is created at bottom surface 102B of the terminal battery, that snug fit will ensure that the cans of the batteries in the series configuration, with spacers between each pair of batteries, create a solid continuous length of material in which no meaningful force is applied to the battery terminals between two adjoining batteries while the terminal end of the terminal battery is retained at its can, rather than at its anode cap.

Figure 53:
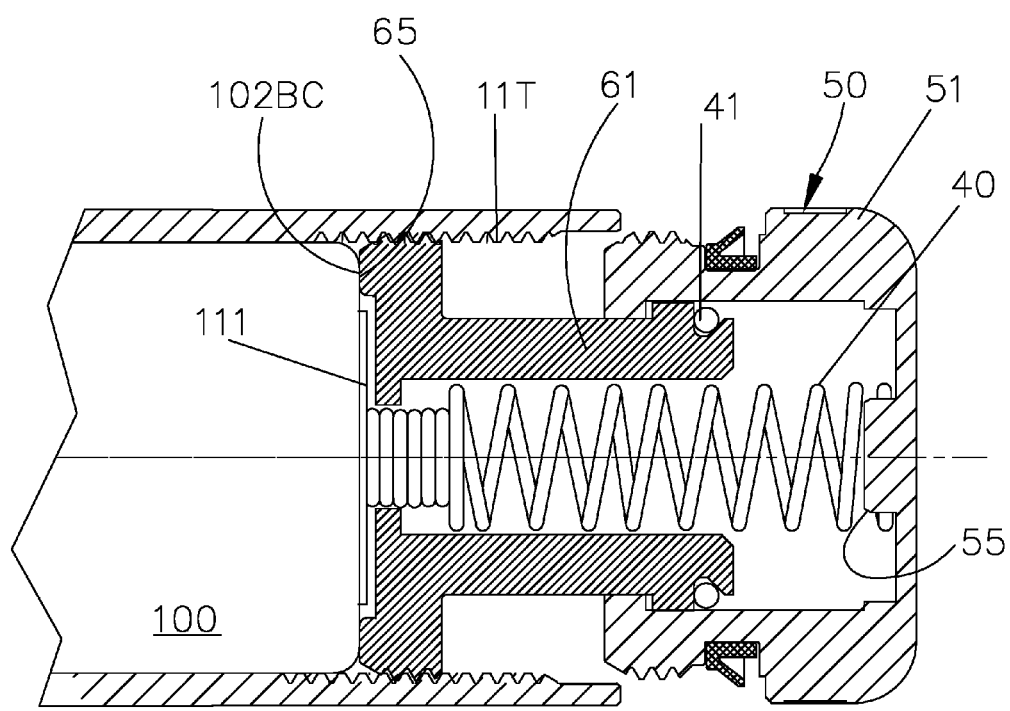
Figure 54:
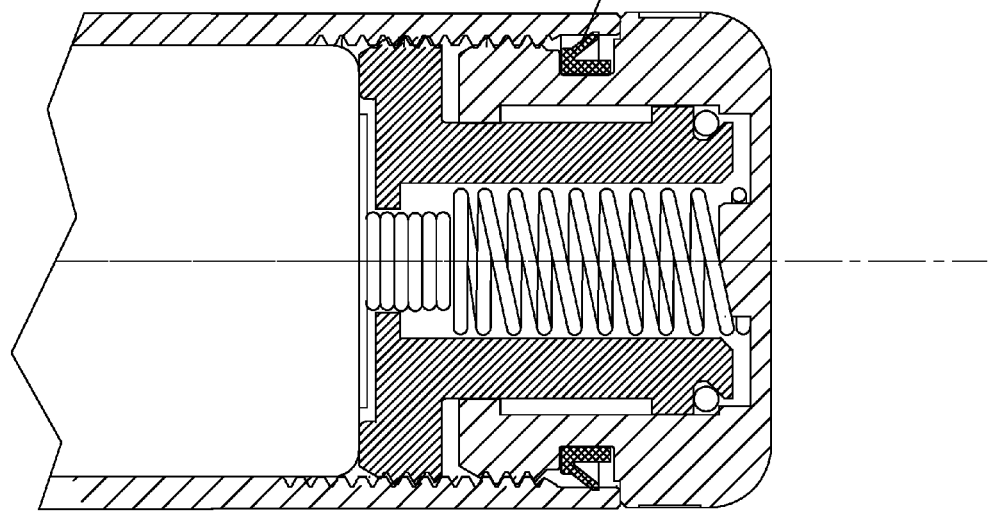
FIG. 54 shows the outer tail cap member of FIG. 53 screwed into the inner tail cap member.
Figure 55:
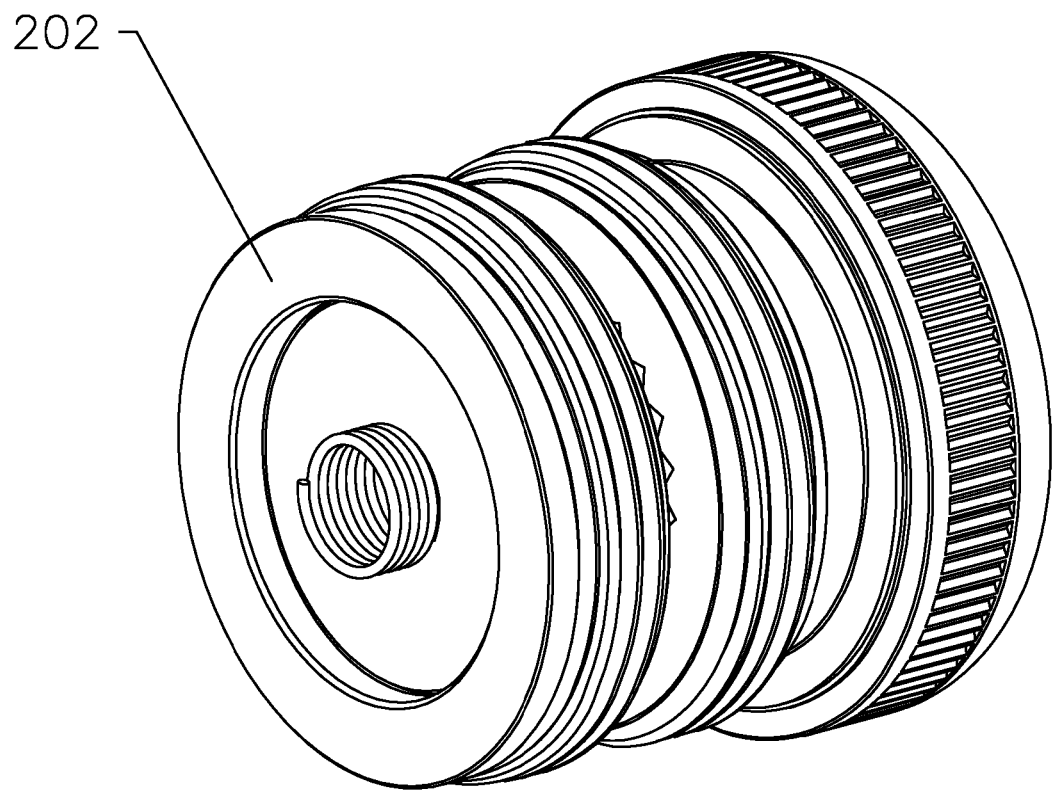
Figure 56:
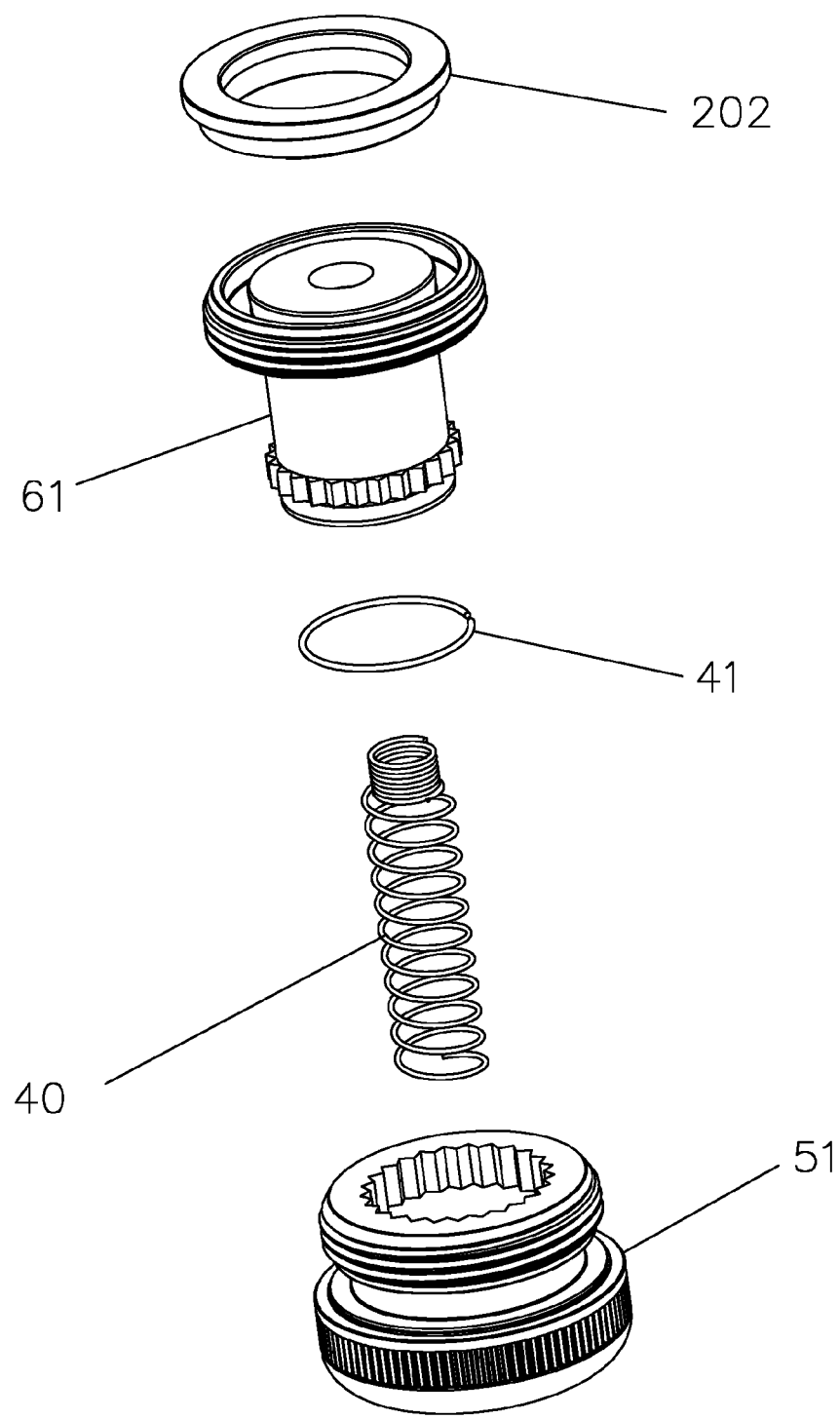
FIG. 56 is an exploded view of the assembly of FIG. 55 and FIGS. 57 and 58 are identical to FIGS. 53 and 54 except for the addition of shock absorbing material 202.
Figure 57:
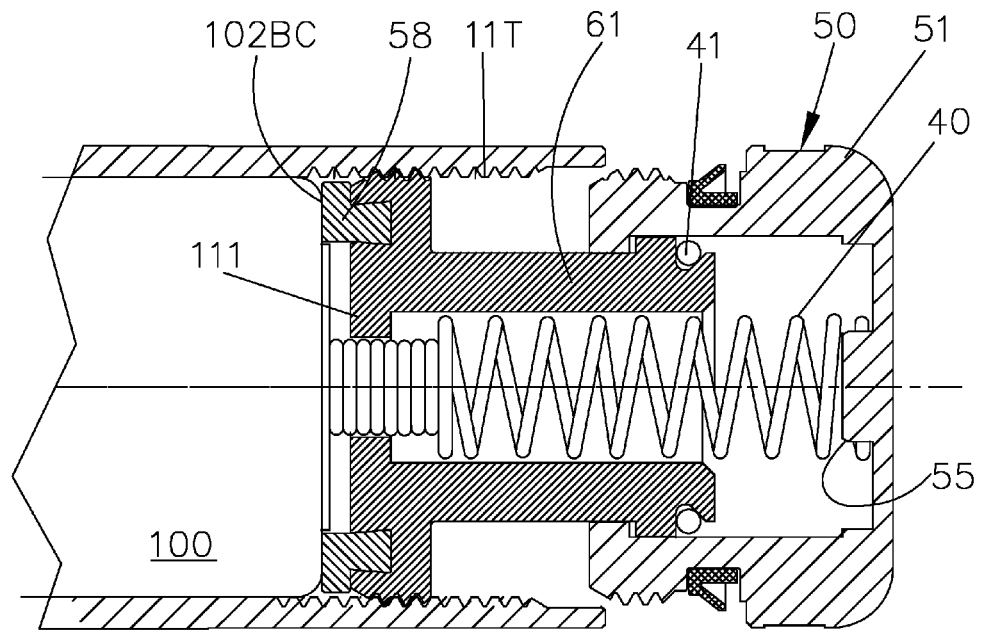
Figure 58:
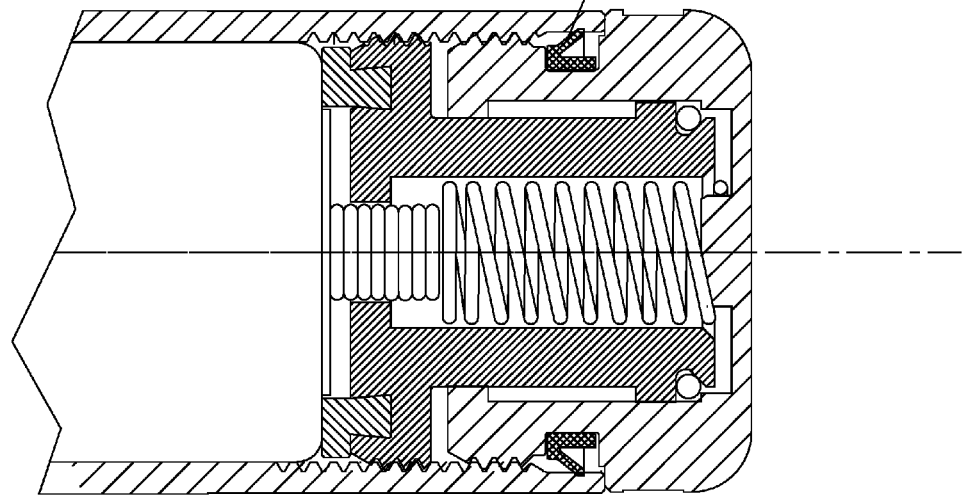

One especially preferred embodiment of a device which creates a snug fit for the terminal end of a terminal battery is a mechanical contact that can be tightened against the bottom surface 102 of the terminal battery until a snug fit is obtained, and one example of such a device is disclosed in FIGS. 46-52, which is especially useful for the device category of a flashlight, in which a two piece tail cap 50 is provided in which an inner member 61 of tail cap 50 can be driven by an outer member 51 of tail cap 50 to screw into flashlight barrel threads 11T so that bottom surface 102BC of the terminal battery is held snugly by battery can engaging surface 65 of inner member 61 as illustrated in FIG. 53. In this especially preferred embodiment, mating splines are used to illustrate one mechanical driving mechanism; however, this embodiment is meant to be illustrative, rather than limiting, and any other suitable driving mechanism could also be used in alternative embodiments within the scope of the present invention. Returning to FIG. 53, inner member 61 is driven by engaging female splines 54F in outer member 51 of tail cap 50 with male splines 64M of inner member 61 and then using outer member 51 to screw inner member 61 into position; once inner member 61 is fully screwed into position, female splines 54F and 64M are disengaged and threads 52 of outer member 51 are then screwed into flashlight barrel threads 11T to secure outer member 51 to barrel 11 as illustrated in FIG. 54. It is especially useful if a lock ring 41 is used to secure outer member 51 (which has a lip seal 42) to inner member 61 (see FIGS. 53 and 54); inner member 61 and lock ring 41 can be designed so that lock ring 41 will not be removable once it is in place or so that it can be removable with a certain amount of force. Because the two piece construction of tail cap 50 allows battery can engaging surface 65 to snugly hold bottom surface 102BC of the terminal battery (and it is especially preferred that battery can engaging surface 65 engage all or substantially all of bottom surface 102BC, but not anode cap 111), an electrically conductive spring 40 may or may not be required, depending upon whether bottom surface 102BC is insulated, such as by a battery wrap 102W; but, even if it is required, conductive spring 40 need not be a strongly compressed spring and can have a minimum contact force (of around 200 grams or 0.44 lbs.)—just enough to ensure electrical contact, but not so much that it will provide a mechanism for imparting a damaging force to the terminal end of the terminal battery in the event of extreme shock. (Springs used in tail caps of prior art flashlights to create a biasing means forcing the batteries toward the top contact could have a much higher contact force, on the order of 10 lbs. or more.) Spring 40, as illustrated in FIG. 53, can be secured by spring contact 55.

One way of minimizing any potential damaging force that spring 40 might impart to the terminal end of the terminal battery in the event of extreme shock is to minimize its length and strength.

The two piece tail cap construction described so far can also be used in devices that utilize rechargeable battery packs, an example of which is a NiMH battery for the Mag Charger® LED flashlight. In such a device, multiple rechargeable batteries are wrapped together in a snug casing, which is electrically insulating, so the terminal end of the terminal battery extends out of the casing, and a button end of a first battery also extends out of the casing, but the other ends of the batteries held in series are held tightly together inside of the battery wrap. In such a device, while shock absorbing spacers 2 might be used inside of the casing when the battery pack is manufactured, it is not possible to use shock absorbing spacers 2 with existing battery packs without destroying the battery wrap, which is not desirable; however, the two piece tail cap construction already described will still prove useful with such battery packs.

The two piece tail cap construction already described can also be modified to provide a shock absorbing material 202 that makes contact with bottom surface 102BC of the terminal battery, and FIGS. 55-58 illustrate one example of how such a shock absorbing material can be provided. In this especially preferred embodiment, shock absorbing material 202 is held or mounted to inner member 61 of tail cap 50, shock absorbing material 202 is configured to absorb a primary impact force imparted between it and bottom surface 102BC of can 102, and shock absorbing material 202 may be similar or identical to that used in shock absorbing spacer 2. Such construction is also especially preferred for use with rechargeable battery packs that do not utilize shock absorbing spacers between batteries contained with the battery packs.

Because there are millions of flashlights already in use, it is also desirable to provide a kit and method by which such existing flashlights can benefit from the teachings of the present invention.

As already noted, flashlights in use today typically have a compression spring that serves both as an electrical contact for the terminal battery and as a biasing means so as to keep the batteries in series held in electrical contact by biasing the bottom flat contact of the terminal battery toward the top contact. This means that the compression spring is usually fairly strong (on the order of 10 pounds or more biasing force), and it exerts a strong compressive force against bottom flat contact 111 of the terminal battery (not just to maintain electrical contact, but also to keep the batteries biased toward the top contact); however, when the battery receives a shock, movement of the batteries against the strong compression spring causes the spring to further compress, applying even greater compression force against bottom flat contact 111. By contrast, the present invention seeks to minimize the compressive force applied against bottom flat contact 111 of the terminal battery and to rely upon a terminal end shock absorber to both absorb some shock as well as transfer energy through bottom surface 102BC of can 102 of the terminal battery, rather than through bottom flat contact 111.

Figure 59:
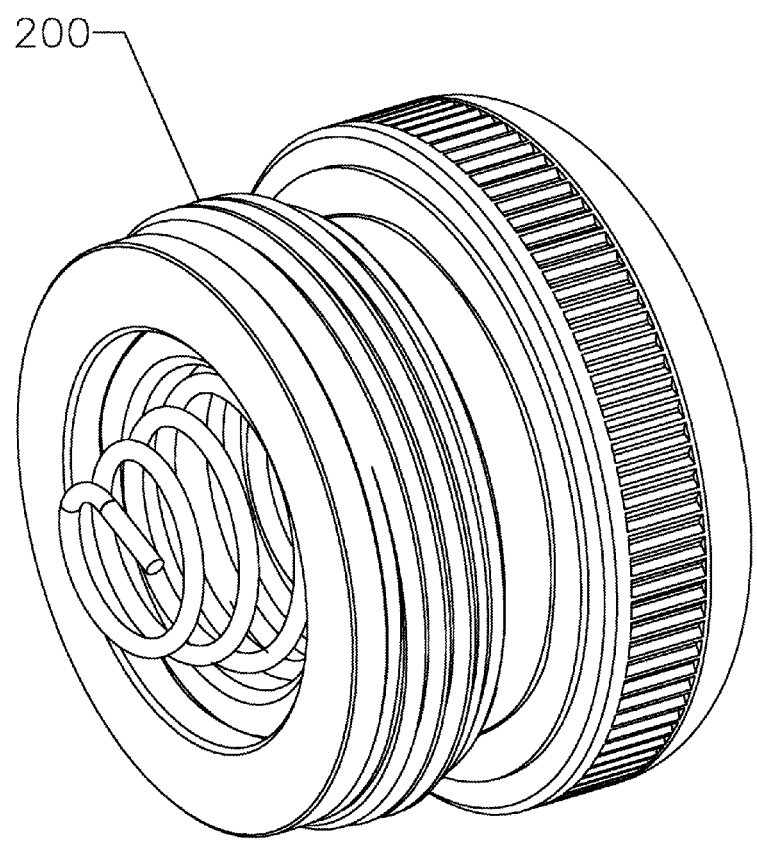
Figure 60:
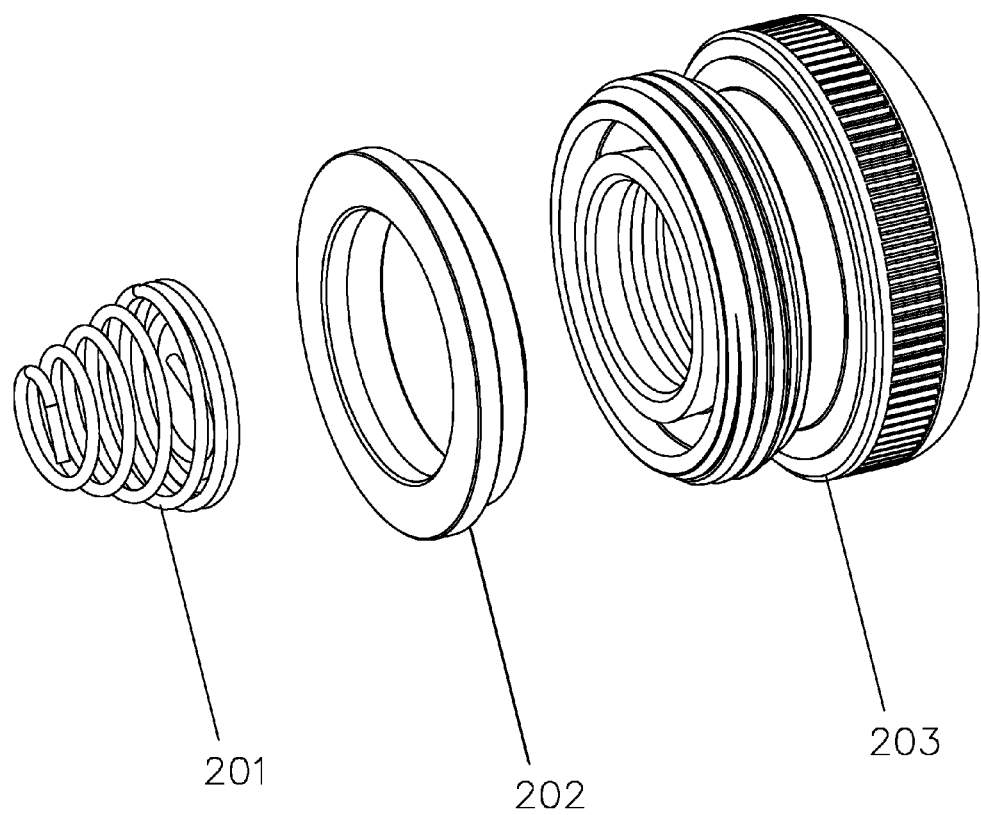
FIG. 60 is an exploded view of FIG. 59.

One way a flashlight can be retrofitted with a terminal end shock absorber in accordance with the present invention is to replace an existing tail cap assembly with its compression spring with a new tail cap assembly 200 such as is illustrated in FIGS. 59 and 60. Replacement tail cap assembly 200 utilizes a shock absorbing material 202, a tail cap resilient contact 201 and a tail cap 203. Shock absorbing material 202 is configured to absorb a primary impact force imparted between it and bottom surface 102BC of can 102 of the terminal battery while the tail cap resilient contact is configured to absorb a secondary impact force imparted between it and the flat contact of the terminal battery, wherein the secondary impact force is substantially less than the primary impact force. While tail cap resilient contact 201 might be configured similarly to resilient contact 22, it may also be configured as a small compression spring (with a minimum biasing force sufficient to maintain electrical contact, say around approximately half a pound, but not a strong biasing force, say around a pound or less when the flashlight is in a resting position), as illustrated in FIG. 60, which may be more suitable for use in a replacement kit in which all of the components of the flashlight have not been designed so as to take advantage of use of one or more shock absorbing spacer assemblies and a terminal end shock absorber. Shock absorbing material 202 may be similar or identical to that used in shock absorbing spacer 2.

Figure 61:
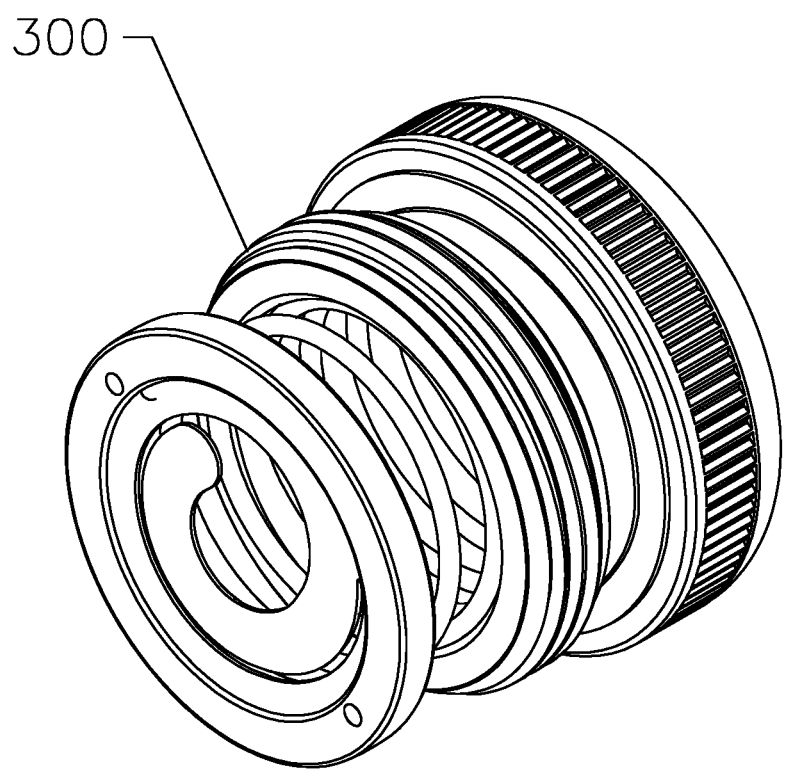
Figure 62:
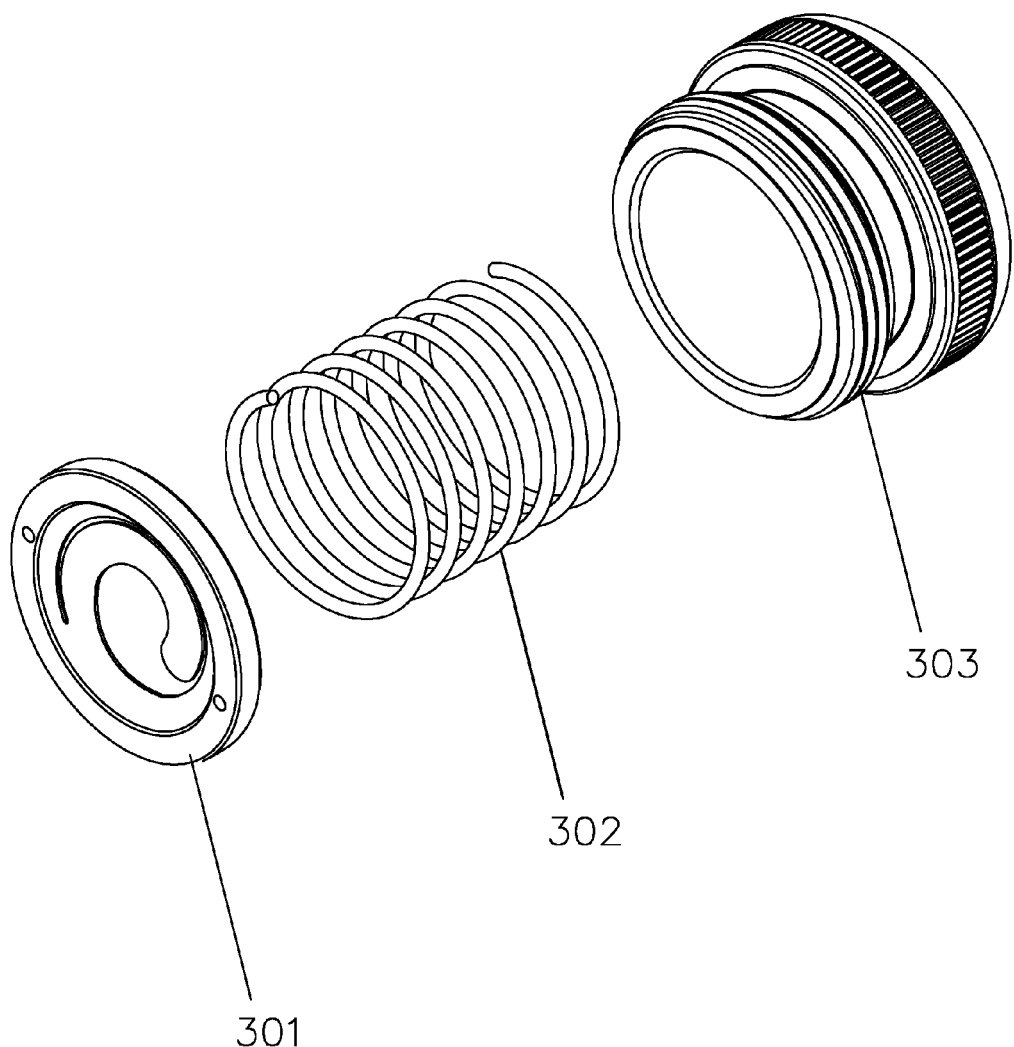
FIG. 62 is an exploded view of FIG. 61.

An alternative embodiment to that shown in FIGS. 59 and 60 is to utilize a shock absorbing spacer 2, as already disclosed, which is modified in tail cap assembly 300 as illustrated in FIGS. 61 and 62. In this embodiment, the contacts with the terminal end of the terminal battery (or the terminal end of a rechargeable battery pack) of modified spacer 301 remain the same as already described, but the other contacts are replaced with a spring 302 which makes electrical contact with tail cap 303.

While the invention has been described herein with reference to certain preferred embodiments, those embodiments have been presented by way of example only, and not to limit the scope of the invention. Additional embodiments will be obvious to those skilled in the art having the benefit of this detailed description. For example, because the terminal end shock absorber does not need to separate two terminals of batteries in series, but a terminal end of a terminal battery from a tail cap, the terminal end shock absorber might be constructed to provide shock absorption through mechanical means, or means other than using a shock absorbing material similar to that of shock absorbing spacer 2; thus, for example, a tail cap might be designed to include one or more mechanical pistons that compress air within one or more enclosed spaces with appropriate pressure relief.

Accordingly, still further changes and modifications in the actual concepts descried herein can readily be made without departing from the spirit and scope of the disclosed inventions as defined by the following claims.

What is claimed is:

1. A flashlight, comprising:
   a flashlight barrel that is thermally conductive;
   a light emitting diode ("LED") package contained within the flashlight barrel, said LED package comprising:
      a substrate;
      an LED die atop a substrate top surface; and
      a first electrically conductive contact, a second electrically conductive contact and an electrically neutral contact located under the substrate relative to the LED die, each of which is electrically isolated from each other;
      wherein the LED die emits light out of a first end of the flashlight barrel when power is applied to the first and the second electrically conductive contacts and heat is transferred from the LED die through the substrate to the electrically neutral contact; and
   a heatsink assembly held within the outer casing, said heatsink assembly comprising:
      an outer electrically conductive member that is thermally conductive and which is mechanically connected to the flashlight barrel;
      an electrically insulating material which is held within the outer electrically conductive member; and
      an inner electrically conductive member which is positioned and electrically isolated from the outer electrically conductive member by the electrically insulating material;
      wherein the first electrically conductive member of the LED package is electrically bonded to a top surface of the outer electrically conductive member and the second electrically conductive member of the LED package is electrically bonded to the inner electrically conductive member;
      wherein the electrically neutral contact is thermally bonded directly to the top surface of the outer electrically conductive member without the use of a printed circuit board ("PCB"); and
      wherein the LED package is turned on when power from an electrical circuit is applied to the outer electrically conductive member and the inner electrically conductive member.

2. The flashlight of claim 1, wherein the outer electrically conductive member is integrally formed with the flashlight barrel and the thermal path only included one thermal junction between the outer electrically conductive member and the electrically neutral contact of the LED package.

3. The flashlight of claim 1, wherein the first electrically conductive member is soldered to the top surface and the second electrically conductive member is soldered to the inner electrically conductive member.

4. The flashlight of claim 3, wherein the electrically neutral contact is soldered to the top surface.

5. The flashlight of claim 1, further comprising:
   a tail cap removably screwed into a barrel thread of a second end of the flashlight barrel; and
   a plurality of batteries held in a series configuration in the flashlight barrel, wherein each of the plurality of batteries is comprised of a metal can which holds a cathode, an anode and a current collector, said can having a first end with a first contact having a first polarity and a second end with a second contact having a second polarity, said two or more batteries having a terminal battery in which its second end is a terminal end of the series configuration which is held proximate to the tail cap.

6. The flashlight of claim 5, wherein a snug mechanical fit is created between a bottom surface of the metal can of the terminal battery and a first surface of the tail cap.

7. The flashlight of claim 6, wherein the first surface of the tail cap is comprised of a shock absorbing material which is compressed as the tail cap is secured to the flashlight barrel to create the snug mechanical fit.

8. The flashlight of claim 6, wherein an adjustable mechanical retention device creates the snug mechanical fit.

9. The flashlight of claim 8, wherein the adjustable mechanical retention device is comprised of the tail cap and the tail cap is comprised of:
   an inner member which screws into the barrel thread of the second end of the flashlight barrel; and
   an outer member which screws into the barrel thread of the second end of the flashlight barrel;
   wherein the outer member can be used to drive the inner member into the second end of the barrel and then disengage from the inner member and close off the second end of the flashlight barrel.

10. The flashlight of claim 6, further comprising:
    for each pair of batteries held in series in the flashlight barrel, a spacer having a thickness sufficient to prevent the second end of a first battery from contacting the first end of a second battery; and
    for each spacer, a resilient contact for providing a resilient electrical contact between the second end of the first battery and the first end of the second battery.

11. The flashlight of claim 10, wherein the spacer is comprised of a shock absorbing material.

12. The flashlight of claim 6, wherein the plurality of batteries are rechargeable and are held together as an integral unit by a casing.

13. The flashlight of claim 6, further comprising:
    a tail cap resilient contact for providing electrical contact between the terminal end and a tail cap contact point within the electrical circuit, said tail cap resilient contact applying a contact force on the terminal end of less than one pound when the flashlight is in a resting position.

14. The flashlight of claim 13, wherein the tail cap resilient contact is comprised of a spring and the contact force has a minimum contact force of approximately half a pound.

15. A lighting apparatus, comprising:
an outside housing casing that is thermally conductive;
a light emitting diode ("LED") package contained within the flashlight barrel, said LED package comprising an LED die mounted on a substrate, a first electrically conductive contact for providing power to the LED die, a second electrically conductive contact for providing power to the LED die and an LED package heatsink with an outside contact for transferring heat from the LED die to the outside contact, wherein the LED die emits light out of a first end of the flashlight barrel when power is applied to the first and the second electrically conductive contacts; and
a heatsink assembly held within the outside housing casing, said heatsink assembly comprising:
an outer electrically conductive member that is thermally conductive and which is mechanically connected to the outside housing casing;
an electrically insulating material which is held within the outer electrically conductive member; and
an inner electrically conductive member which is positioned and electrically isolated from the outer electrically conductive member by the electrically insulating material;
wherein the first electrically conductive member of the LED package is electrically bonded to a top surface of the outer electrically conductive member and the second electrically conductive member of the LED package is electrically bonded to the inner electrically conductive member;
wherein the outside contact is thermally bonded to the top surface of the outer electrically conductive member without the use of a printed circuit board ("PCB");
wherein the LED package is turned on when power from an electrical circuit is applied to the outer electrically conductive member and the inner electrically conductive member; and
wherein a thermal path is created between the outside housing casing and the outside contact of the LED package which includes two or less thermal junctions between the outside housing casing and the outside contact of said LED package.

16. The lighting apparatus of claim 15, further comprising:
a battery power source which provides power for the electrical circuit, said battery power source having a terminal end with an outer can casing and an electrical contact cap, said electrical contact cap being electrically connected within the electrical circuit by a terminal cap electrical connector, said battery power source being held within a battery compartment of the lighting apparatus by a snug mechanical fit created between the outer can casing and a battery power source retention device.

17. The lighting apparatus of claim 16, wherein the battery power source retention device is adjustable so as to vary a force applied by a surface of the battery power source retention device against the outer can casing.

18. The lighting apparatus of claim 17, wherein the battery power source is comprised of a plurality of batteries held in a series configuration in the battery compartment, wherein each of the plurality of batteries is comprised of a metal can which holds a cathode, an anode and a current collector, said can having a first end with a first contact having a first polarity and a second end with a second contact having a second polarity.

19. The lighting apparatus of claim 18, further comprising:
for each pair of batteries held in series in the battery compartment, a spacer having a thickness sufficient to prevent the second end of a first battery from contacting the first end of a second battery; and
for each spacer, a resilient contact for providing a resilient electrical contact between the second end of the first battery and the first end of the second battery.

20. The lighting apparatus of claim 18, wherein the terminal cap electrical connector is biased against the electrical contact cap with a contact force of less than one pound when the lighting apparatus is in a resting position.

* * * * *